(12) United States Patent
Huang

(10) Patent No.: US 9,755,519 B1
(45) Date of Patent: Sep. 5, 2017

(54) SWITCHING POWER CONVERTER CONTROL

(71) Applicant: Powerventure Semiconductor Limited, London (GB)

(72) Inventor: Chi-Chia Huang, Hsinchu (TW)

(73) Assignee: PowerVenture Semiconductor Limited, London (GB)

( * ) Notice: Subject to any disclaimer, the term of this patent is extended or adjusted under 35 U.S.C. 154(b) by 0 days.

(21) Appl. No.: 15/449,157

(22) Filed: Mar. 3, 2017

(51) Int. Cl.
| | |
|---|---|
| G05F 1/00 | (2006.01) |
| H02M 3/158 | (2006.01) |
| H02M 1/08 | (2006.01) |
| H03K 17/687 | (2006.01) |
| H03K 5/24 | (2006.01) |
| H02M 1/00 | (2006.01) |

(52) U.S. Cl.
CPC ............ *H02M 3/158* (2013.01); *H02M 1/08* (2013.01); *H03K 5/24* (2013.01); *H03K 17/687* (2013.01); *H02M 2001/0009* (2013.01)

(58) Field of Classification Search
CPC .. H02M 3/158; H02M 3/1588; H02M 3/1582; H02M 2001/0045; H02M 2001/0067
See application file for complete search history.

(56) References Cited

U.S. PATENT DOCUMENTS

| 4,199,728 | A | 4/1980 | Carpenter |
| 5,956,239 | A | 9/1999 | Giacomini |
| 6,356,063 | B1 | 3/2002 | Brooks |
| 8,593,125 | B1 | 11/2013 | Xue |
| 2007/0164720 | A1 | 7/2007 | Lalithambika et al. |
| 2007/0252567 | A1 | 11/2007 | Dearn et al. |
| 2010/0123446 | A1 | 5/2010 | Cheng et al. |
| 2012/0223691 | A1 | 9/2012 | Weinstein et al. |
| 2014/0091774 | A1* | 4/2014 | Srinivasan et al. ... H02M 3/158 323/271 |

(Continued)

OTHER PUBLICATIONS

"A Ripple-Based Constant On-Time Control With Virtual Inductor Current and Offset Cancellation for DC Power Converters," by Yu-Cheng Lin et al., IEEE Transactions on Power Electronics, vol. 27, No. 10, Oct. 2012, pp. 4301-4310.

(Continued)

*Primary Examiner* — Adolf Berhane
*Assistant Examiner* — Afework Demisse
(74) *Attorney, Agent, or Firm* — Saile Ackerman LLC; Stephen B. Ackerman

(57) ABSTRACT

A switching power converter with good stability and transient response is presented. There is provided a controller for a switching power converter of the type comprising one or more power switches. The controller contains a pulse width modulation comparator arranged to output a digital control signal to control the power switches of the switching power converter. A first input of the pulse width modulation comparator is derived from an output voltage of the switching power converter via a first feedback path. A second input of the pulse width modulation comparator is derived from the output voltage of the switching power converter via a second feedback path. One of the feedback paths has a signal extractor and a differential amplifier arranged to filter the output voltage and to provide good ground noise rejection.

22 Claims, 20 Drawing Sheets

(56) References Cited

U.S. PATENT DOCUMENTS

2014/0253064 A1    9/2014  Swanson
2014/0292288 A1*  10/2014  Yan et al. ............. H02M 3/156
                                                      323/234

OTHER PUBLICATIONS

"Adaptive Ripple-Based Constant On-Time Control with Internal Ramp Compensations for Buck Converters," by Kuang-Yao (Brian) Cheng et al., 2014 IEEE Applied Power Electronics Conference and Exposition—APEC 2014, Mar. 16-20, 2014, pp. 440-446.

"A novel current mode buck regulator with fast transient response using derivative ripple voltage in 180nm," by Sreehari Rao Patri et al., International Journal of Recent Trends in Engineering, vol. 2, No. 5, Nov. 2009, pp. 85-90.

"Quadratic Differential and Integration Technique in $V^2$ Control Buck Converter With Small ESR Capacitor," by Yu-Huei Lee et al., IEEE Transactions on Power Electronics, vol. 25, No. 4, Apr. 2010, pp. 829-838.

"Subharmonic Analysis for Buck Converters With Constant On-Time Control and Ramp Compensation," by Ting Qian, IEEE Transactions on Industrial Electronics, vol. 60, No. 5, May 2013, pp. 1780-1786.

"DC-DC Converter With Digital Adaptive Slope Control in Auxiliary Phase for Optimal Transient Response and Improved Efficiency," by Yue Wen et al., IEEE Transactions on Power Electronics, vol. 27, No. 7, Jul. 2012, pp. 3396-3409.

"Digital Enhanced $V^2$-Type Constant On-Time Control using Inductor Current Ramp Estimator for a Buck Converter with Small ESR Capacitors," by Kuang-Yao Cheng et al., IEEE Transactions on Power Electronics, 2013, vol. 28, Issue: 3, pp. 1241-1252.

"Design of a Fast-Transient Current-Mode Buck DC-DC Converter," by Chia-Chieh Wong et al., 2013 1st International Future Energy Electronics Conference (IFEEC), Nov. 3-6, 2013, pp. 767-771.

"Fast Transient Technique (FTT) in Buck Current-Mode DC-DC Converters for Low-Voltage SoC System," by Chia-Hsiang Lin et al., IEEE 2008 Custom Integrated Circuits Conference (CICC), pp. 25-28.

"Fast Transient (FT) Technique With Adaptive Phase Margin (APM) for Current Mode DC-DC Buck Converters," by Yu-Huei Lee et al., IEEE Transactions on Very Large Scale Integration (VLSI) Syste4ms, 2012, vol. 20, Issue: 10, Oct. 2012, pp. 1781-1793.

"Advanced Control for Very Fast DC-DC Converters Based on Hysteresis of the Cout Current," by Santa Concepcion Huerta et al., IEEE Transactions on Circuits and Systems, I: Regular Papers, vol. 60, No. 4, Apr. 2013, pp. 1052-1061.

"Fast Adaptive on Time Control for Transient Performance Improvement," by Syed Bari et al., 2015 IEEE Applied Power Electronics Conference and Exposition (APEC), Mar. 15-19, 2015, pp. 397-403.

"Theory of Operation of V2 Controllers with Emphasis on Applications using MLCC's for Output Filtering," by Dennis Solley, ON Semiconductor, Semiconductor Components Industries, LLC, May 2009, Publication No. AND8276/D, pp. 1-8.

Co-pending US Patent DS15-083, "Switch Mode Power Converter with Overshoot and Undershoot Transient Control Circuits," by Seiichi Ozawa et al., U.S. Appl. No. 15/260,379, filed Sep. 9, 2016, 51 pgs.

* cited by examiner

SWITCHING POWER CONVERTER CONTROL

RELATED PATENT APPLICATION

This application is related to application Ser. No. 15/260,379, filed on Sep. 9, 2016, assigned to a common assignee, and which is herein incorporated by reference in its entirety.

TECHNICAL FIELD

The present disclosure relates to apparatus and methods for switching power converter control, and in particular to a controller for a switching power converter, a method of controlling the operation of a switching power converter.

BACKGROUND

A switching power converter comprises an energy storage element such as an inductor and a set of switching elements that selectively couple the energy storage element between an input and output. A controller operates the switching elements such that a regulated output voltage is supplied. There are various well known types of switching regulators. For example, a buck converter steps down an input voltage to a lower output voltage, a boost converter steps up an input voltage to a higher output voltage, and a buck-boost converter can either step up or step down the input voltage to provide the desired output voltage.

It is desired for a switching converter to have good stability and transient response. It is known to address this by accurately sensing the inductor current.

Sensing from an inductor input node (SW node) can get accurate inductor current information. However, doing this is costly and complex for high-voltage converters.

Besides, the inductor input node cannot reflect the instant change on the output voltage so this technique cannot provide fast transient response.

The inductor current may also be sensed from the inductor output node. This has a lower cost associated with it and provides good transient response, but one cannot get accurate inductor current information when different external components are used.

Sensing from both the inductor input and output nodes is also possible and provides a responsive solution, but it is still difficult to sense under high-voltage applications.

All of these existing approaches suffer from poor ground noise rejection.

SUMMARY

According to a first aspect of the disclosure there is provided a controller for a switching power converter of the type comprising one or more power switches, said controller comprising: a pulse width modulation comparator arranged to output a digital control signal to control the power switches of the switching power converter; a first input of the pulse width modulation comparator is derived from an output voltage of the switching power converter via a first feedback path; a second input of the pulse width modulation comparator is derived from the output voltage of the switching power converter via a second feedback path; wherein one of the feedback paths comprises a signal extractor and a differential amplifier; and the signal extractor is arranged to filter the output voltage to obtain a first voltage signal in a first frequency range and a second voltage signal in a second frequency range being different from said first frequency range, said first and second voltage signals sharing a common noise component; and to present said first and second voltage signals as respective first and second inputs to the differential amplifier.

Optionally, the signal extractor comprises: a first filter network; a second filter network; a first coupling network arranged to extract ground noise and couple said extracted ground noise to both of said first and second filter networks; and a second coupling network is arranged to extract a feedback voltage comprising contributions from the output voltage and ground noise for processing by both of said first and second filter networks.

Optionally, the first and second filter networks act sequentially on the feedback voltage.

Optionally, the first and second filter networks are both coupled with the feedback voltage.

Optionally, the first filter network has a first cut-off frequency and is arranged to high-pass filter the feedback voltage and to low-pass filter the ground noise, and the second filter network has a second cut-off frequency and is arranged to high-pass filter the feedback voltage and to low-pass filter the ground noise.

Optionally, the first filter network has a first cut-off frequency and is arranged to low-pass filter the feedback voltage and to high-pass filter the ground noise, and the second filter network has a second cut-off frequency and is arranged to low-pass filter the feedback voltage and to high-pass filter the ground noise.

Optionally, the first coupling network comprises a current source for providing a bias current, and a grounded resistive element; said current source and resistive element being coupled for providing an output with ground noise.

Optionally, the controller further comprises a second resistive element in series with said grounded resistive element.

Optionally, the grounded resistive element and/or the second resistive element comprises a diode connected transistor.

Optionally, the second coupling network comprises a potential divider such that the feedback voltage comprises a scaled output voltage and ground noise.

Optionally, the differential amplifier is a transconductance amplifier that outputs a current signal that is passed to a reference resistor to generate a voltage ramp that is coupled to the second input of the pulse width modulation comparator.

According to a second aspect of the disclosure there is provided a method of controlling the operation of a switching power converter of the type comprising a pulse width modulation comparator and one or more power switches, said method comprising: deriving a first PWM input from an output voltage and presenting the input via a first feedback path; deriving a second PWM input from an output voltage and presenting the input via a second feedback path; at one of said paths, filtering the output voltage to obtain a first voltage signal in a first frequency range and a second voltage signal in a second frequency range being different from said first frequency range, said first and second voltage signals sharing a common noise component; and presenting said first and second voltage signals as respective first and second inputs to a differential amplifier.

The method of the second aspect may also comprise providing or operating a system according to the features of the first aspect, alone or in any combination as described above and herein.

BRIEF DESCRIPTION OF THE DRAWINGS

The disclosure will be described below, by way of example only, with reference to the accompanying drawings, in which.

DESCRIPTION

Figure 1:
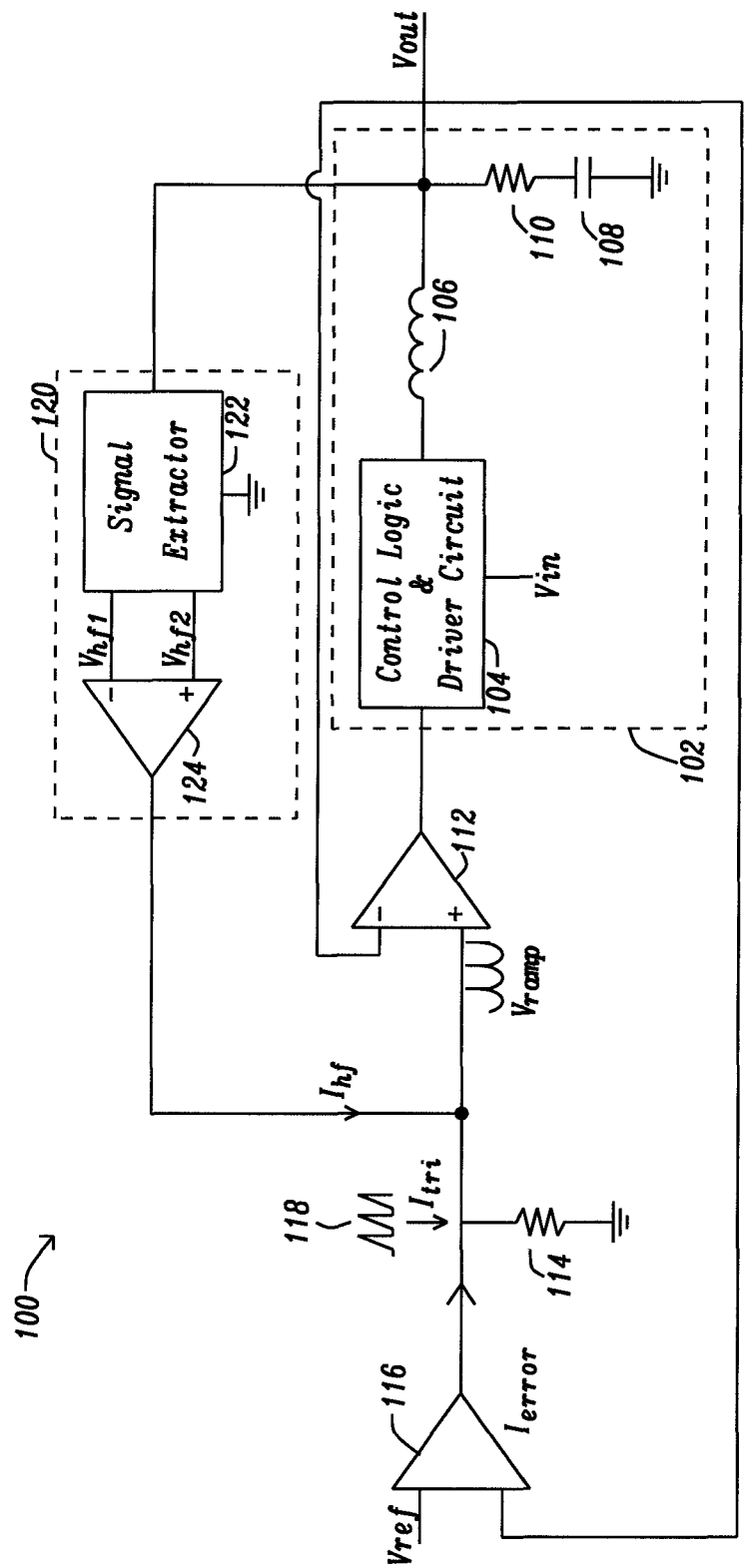
FIG. 1 shows a switching power converter with a compensator circuit that comprises a differential amplifier and a signal extractor in accordance with the disclosure.

FIG. 1 shows a switching power converter 100 that receives an input voltage Vin and provides a regulated output voltage Vout. The switching power converter in this embodiment is in the form of a buck converter. The switching power converter in this embodiment includes a power stage 102 comprising a control logic and driver circuit 104 with a first input for receiving an input voltage Vin. The switching power converter further includes a controller comprising a pulse width modulation (PWM) comparator 112. The inputs for the PWM comparator 112 are provided via a first feedback path and a second feedback path which are both derived from the output voltage Vout, as will be discussed in more detail below.

The control logic and driver circuit 104 comprises one or more power switches, and a set of circuit components that act to control the power switches. In some preferred embodiments, the power switches may comprise a high side and a low side switch, for selectively coupling an output with a relatively high voltage and a relatively low voltage respectively. The power stage 102 may be replaced by circuitry for other types of converters such as a boost converter, buck-boost converter or other type of switching power regulator which is in itself well known to a person skilled in the art.

The control logic and driver circuit 104 may also include a delay line or equivalent delay element which can operate to ensure correct operational timing of the converter. An inductor 106 has a first terminal coupled to a first output of the control logic and driver circuit 104 and has a second terminal connected to an output capacitor 108 with an equivalent series resistance (ESR) 110. The second terminal of the output capacitor 108 is coupled to ground.

The pulse width modulation (PWM) comparator 112 receives a first input at a first input terminal (for example at an inverting terminal) from the output voltage Vout of the switching power converter via the first feedback path and receives a second input at a second input terminal (for example at a non-inverting terminal) from a voltage ramp signal Vramp, that includes a contribution derived from the output voltage Vout, via the second feedback path (as well as a contribution from an external ramp Itri, as discussed elsewhere herein). An output of the PWM comparator 112 is coupled to a second input of the control logic and driver circuit 104. The output of the PWM comparator is a digital signal that is based on a comparison between the first input Vout and the second input Vramp. The digital signal is used to control the switching of the power switches in the control logic and driver circuit 104.

An offset cancellation circuit receives the output voltage Vout and outputs a current signal. In this embodiment offset cancellation circuit is provided by an error amplifier 116. The error amplifier 116 has a first input for receiving a reference voltage Vref and a second input for receiving the output voltage Vout. An output of the error amplifier 116 is coupled to a first terminal of a reference resistor 114. A second terminal of the reference resistor 114 is coupled to ground. The error amplifier 116 outputs an error signal current Ierror. An output of an external current ramp 118 is coupled to the first terminal of the reference resistor 114. The output of the external current ramp 118 is an externally generated current signal Itri with a triangular waveform.

According to the disclosure, one of the feedback paths comprises a signal extractor 122 and a differential amplifier 124, for example a transconductance amplifier. Together these components form a compensator circuit 120 which acts to generate an internal ramp which is injected into the feedback path and which contributes to one of the inputs of the PWM comparator 112.

The signal extractor 122 has a first input coupled to the output voltage Vout and a second input coupled to ground. The signal extractor 122 and a differential amplifier 124 together perform a frequency dependent filtering function on the output voltage Vout and also perform a ground noise rejection function. The first output of the signal extractor 122 is a first filtered voltage signal Vhf1. Vhf1 corresponds to the output voltage Vout having been filtered over a first frequency range. The second output of the signal extractor 122 is a second filtered voltage signal Vhf2. Vhf2 corresponds to the output voltage Vout having been filtered over a second frequency range which is different from the first frequency range. The first and second frequency range may in a preferred embodiment be non-overlapping, but they could alternatively share at least a portion of overlapping frequencies. Vhf1 and Vhf2 share a ground noise signal.

The differential amplifier 124 receives a first input from the first output of the signal extractor 122 Vhf1 and receives a second input from the second output of the signal extractor 122 Vhf2. The differential amplifier 124 has an output internal ramp current Ihf that is proportional or otherwise related to the difference between the first input voltage Vhf1 and the second input voltage Vhf2. The ground noise signal present on both Vhf1 and Vhf2 appears as a common mode signal at the input terminals of the differential amplifier 124. Consequently, the equal ground noise signals at each of the input terminals are subtracted from each other, thereby resulting in a high ground noise rejection ratio. The output of the differential amplifier 124 is coupled to the first terminal of the reference resistor 114.

The first terminal of the reference resistor 114 is coupled to the second input of the PWM comparator 112. The current signal from the output of the error amplifier 116 Ierror, the current signal from the external current ramp 118 Itri and the output of the compensator circuit 120 Ihf are passed to the reference resistor 114, thereby generating the voltage ramp signal Vramp that is received by the second input of the PWM comparator 112. The voltage ramp signal Vramp mimics the voltage ripple on Vout that would be observed if the output capacitor 108 had a large ESR 110. As the internal ramp current Ihf is derived from the output voltage of the switching power converter Vout, the voltage ramp signal Vramp rapidly reflects any variation on Vout, for example during a load transient.

Figure 2:
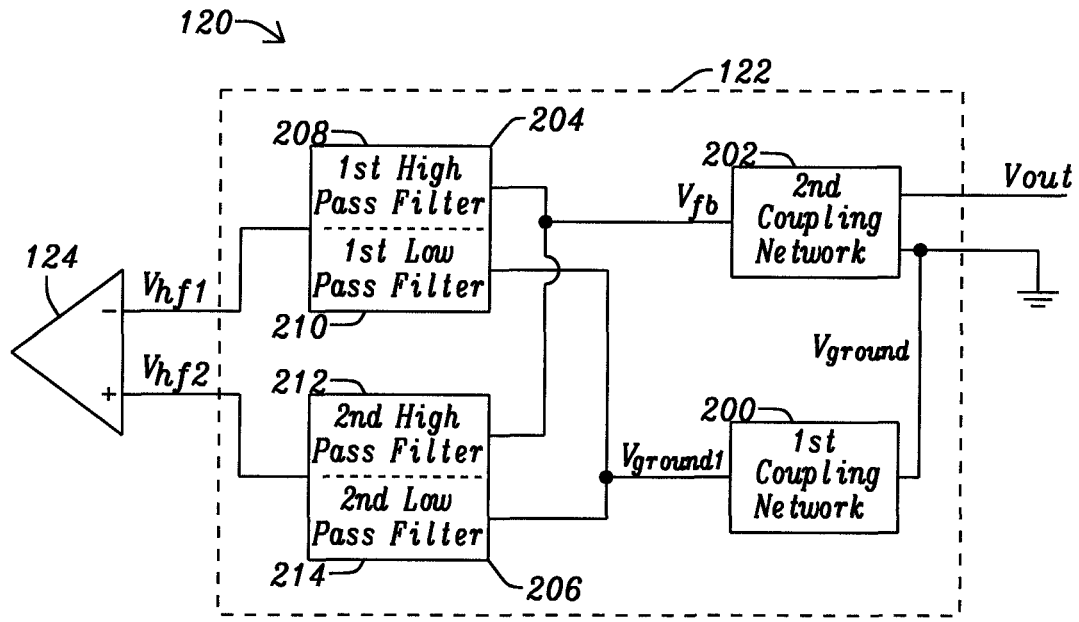
FIG. 2 shows an example embodiment of the compensator circuit 120 from FIG. 1.

FIG. 2 shows an example embodiment of the compensator circuit 120 from FIG. 1. A first input of a first coupling network 200 is coupled to ground. The first coupling network 200 outputs a voltage signal Vground1. This corresponds to Vground together with noise contributions from the operation of the first coupling network 200, which can be assumed to be negligible so that Vground1 can in practice be considered as equivalent to Vground, for this and other embodiments illustrated herein. The switching power converter output voltage Vout is coupled to a first input of a second coupling network 202. A second input of the second coupling network 202 is coupled to ground. The second coupling network 202 outputs a feedback voltage Vfb which comprises contributions from the output voltage Vout and the ground noise Vground.

A first filter network 204 has a first input coupled to the output of the first coupling network 200 for receiving Vground1. The first filter network 204 has a second input coupled to the output of the second coupling network 202 for receiving the feedback voltage Vfb. The first filter network outputs the first filtered voltage ramp Vhf1.

A second filter network 206 has a first input coupled to the output of the first coupling network 200 for receiving Vground1. The second filter network 206 has a second input coupled to the output of the second coupling network 202 for receiving the feedback voltage Vfb. The second filter network outputs the second filtered voltage ramp Vhf2.

In one arrangement of this embodiment, the first filter network 204 comprises a first high pass filter 208 and a first low pass filter 210 which have a first cut-off frequency. The first high pass filter 208 is arranged to filter the voltage feedback Vfb and the first low pass filter 210 is arranged to filter Vground1. The first filtered voltage ramp Vhf1 comprises a filtered voltage feedback signal, where the filtered signal is dependent on the characteristics of the first high pass filter 208, and the unfiltered ground noise signal Vground.

The second filter network 206 comprises a second high pass filter 212 and a second low pass filter 214 which have a second cut-off frequency. The second high pass filter 212 is arranged to filter the voltage feedback Vfb and the second low pass filter 214 is arranged to filter Vground1. The second filtered voltage ramp Vhf2 comprises a filtered voltage feedback signal, where the filtered signal is dependent on the characteristics of the second high pass filter 212, and the unfiltered ground noise signal Vground.

In an alternative arrangement of this embodiment, the nature of the filters 208, 210, 212, 214 is reversed, with high pass filters being replaced by low pass filters and vice versa. So, the first filter network 204 comprises a first low pass filter 208 and a first high pass filter 210 which have a first cut-off frequency. The first low pass filter 208 is arranged to filter the voltage feedback Vfb and the first high pass filter 210 is arranged to filter Vground1. The first filtered voltage ramp Vhf1 comprises a filtered voltage feedback signal, where the filtered signal is dependent on the characteristics of the first low pass filter 208, and the unfiltered ground noise signal Vground. The second filter network 206 comprises a second low pass filter 212 and a second high pass filter 214 which have a second cut-off frequency. The second low pass filter 212 is arranged to filter the voltage feedback Vfb and the second high pass filter 214 is arranged to filter Vground1. The second filtered voltage ramp Vhf2 comprises a filtered voltage feedback signal, where the filtered signal is dependent on the characteristics of the second low pass filter 212, and the unfiltered ground noise signal Vground.

Figure 3:
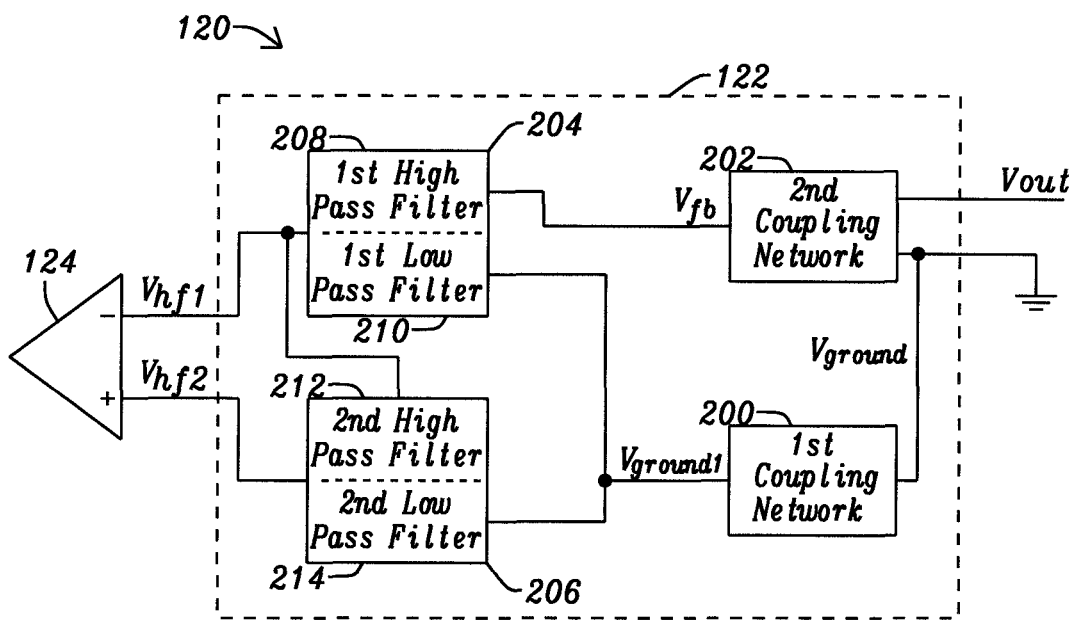
FIG. 3 shows another embodiment of the compensator circuit 120 from FIG. 1.

FIG. 3 shows another embodiment of the compensator circuit 120 from FIG. 1. A first input of a first coupling network 200 is coupled to ground. The first coupling network 200 outputs a voltage signal Vground1 corresponding to the ground noise Vground. The switching power converter output voltage Vout is coupled to a first input of a second coupling network 202. A second input of the second coupling network 202 is coupled to ground. The second coupling network 202 outputs a feedback voltage Vfb which comprises contributions from the output voltage Vout and the ground noise Vground.

A first filter network 204 has a first input coupled to the output of the first coupling network 200 for receiving Vground1. The first filter network 204 has a second input coupled to the output of the second coupling network 202 for receiving the feedback voltage Vfb. The first filter network outputs the first filtered voltage ramp Vhf1.

A second filter network 206 has a first input coupled to the output of the first coupling network 200 for receiving Vground1. The second filter network 206 has a second input coupled to the output of the first coupling network 204 for receiving the first filtered voltage ramp Vhf1. The second filter network outputs the second filtered voltage ramp Vhf2.

Figure 4:
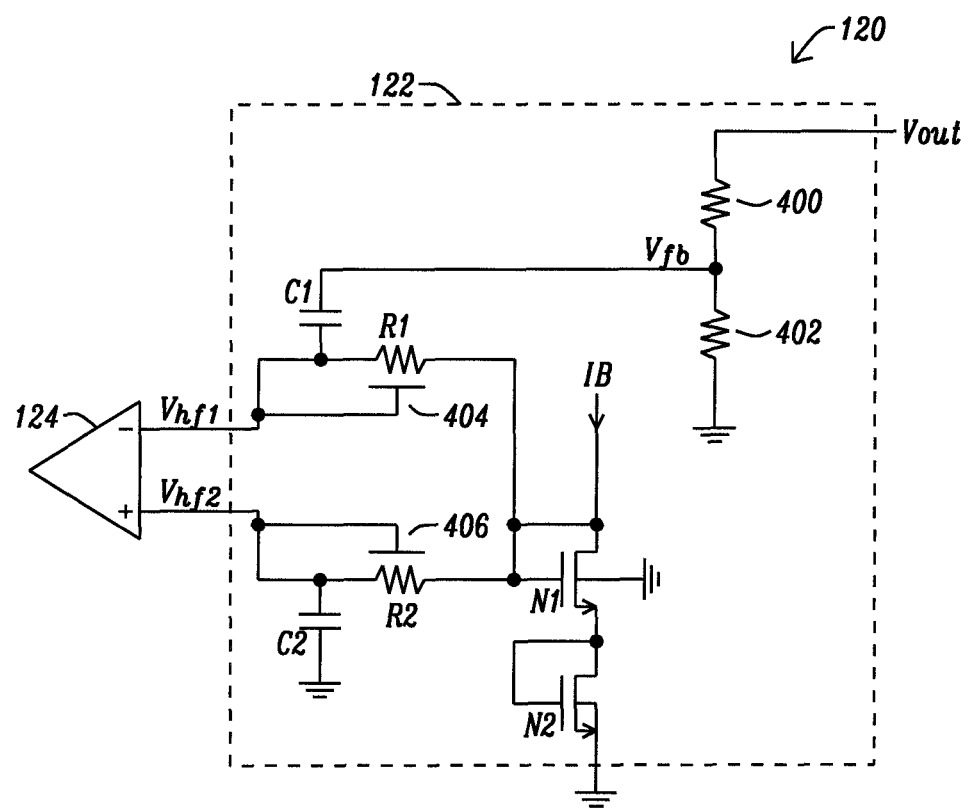
FIG. 4 shows a further example embodiment of the compensator circuit 120 from FIG. 1.

FIG. 4 shows a further example embodiment of the compensator circuit 120 from FIG. 1. A first switch device N1, for example a first MOSFET, has a drain for receiving a bias current IB. The first switch device N1 has a gate coupled with the drain and the drain is coupled to a second terminal of a first polysilicon resistor R1 and a second terminal of a second polysilicon resistor R2. A second switch device N2, for example a second MOSFET, has a gate coupled to a source of the first switch device N1. The second switch device N2 has a gate coupled with a drain. The second switch device N2 has a source coupled to ground.

In operation, the source of the second switch device N2 receives the ground noise which is extracted at the drain of the first switch device N1. The gain of the coupled switch devices N1, N2 is frequency dependent, however the gain is approximately 0 dB in the frequency range at which the compensator circuit 120 operates, for example, in the range 3 kHz to 200 kHz. Consequently, the ground noise extracted at the drain of the first switch device N1 can be considered to be equal to the ground noise received at the source of the second switch device N2.

At a very high frequency, for example 100 GHz, the gain of the coupled switch devices N1, N2 will be less than 0 dB and consequently, the ground noise extracted at the drain of the first switch N1 will be smaller than the ground noise received by the source of the second switch device N2.

The switching power converter output voltage Vout is coupled to a potential divider formed by a first potential divider resistor 400 connected in series with a second potential divider resistor 402 that is coupled to ground. The potential divider is used to generate a feedback voltage Vfb at a node between the first potential divider resistor 400 and the second potential divider resistor 402. A first capacitor C1 has a first terminal coupled to Vfb and a second terminal coupled to a first branching node. The first branching node is coupled to a first terminal of the first polysilicon resistor R1 and the first output of the signal extractor 122. A first high pass filter is formed by the first capacitor C1, the trans-impedance of N1, the trans-impedance of N2, and the first polysilicon resistor R1, wherein an input of the first high pass filter is the feedback voltage Vfb and an output of the first high pass filter is coupled to the first output of the signal extractor 122.

The second terminal of the first polysilicon resistor R1 is coupled to a second terminal of a second polysilicon resistor R2. A first terminal of the second polysilicon resistor R2 is coupled to a second branching node. The second branching node is coupled to the first terminal of a second capacitor C2 and a second terminal of the second capacitor C2 is coupled to ground. The second branching node is coupled to the second output of the signal extractor 122.

The first output of the signal extractor Vhf1 is coupled to an n-type barrier layer NBL. A first NBL-to-poly capacitor 404 is formed by a capacitive coupling of R1 and the NBL. A second NBL-to-poly capacitor 406 is formed by a capacitive coupling of R2 and the NBL.

A second high pass filter is formed by the second capacitor C2, the second polysilicon resistor R2, the trans-impedance of N1, the trans-impedance of N2, and the second NBL-to-poly capacitor 406, wherein the first output of the signal extractor Vhf1 is capacitively coupled into the second high pass filter and an output of the second high pass filter is coupled to the second output of the signal extractor 122.

The second high pass filter acts as a band pass filter on the whole frequency spectrum, and when considering a frequency range that extends beyond the operational frequencies of the compensator circuit 120, for example up to 100 MHz. The second NBL-to-poly capacitor 406 and the second capacitor C2 form a capacitive divider. At high frequencies beyond the operational frequencies of the compensator circuit 120, for example at 100 MHz, the second NBL-to-poly capacitor 406 and the second capacitor both have sufficiently small impedances to ground a corresponding AC current.

The AC current is limited by the impedances of the first potential divider resistor 400, the first resistor R1 and the second resistor R2, therefore the second capacitor C2 will ground the second filtered voltage ramp Vhf2 above about 100 MHz.

If the first switch device N1 and the second switch device N2 are removed, the capacitive divider formed by the second NBL-to-poly capacitor 406 and the second capacitor C2 will have no DC path at the second filtered voltage ramp Vhf2 and will act as an all-pass filter in the operational frequency range of the compensator circuit 120, or a low pass filter on the whole frequency spectrum.

In the frequency range of operation of the compensator circuit 120 it is reasonable to consider only the high pass filtering provided by the second high pass filter.

A first low pass filter is formed by the first polysilicon resistor R1 and the first capacitor C1, wherein an input of the first low pass filter is coupled to the drain of the first switch device N1 and corresponds to Vground1. An output of the first low pass filter is coupled to the first output of the signal extractor 122. A second low pass filter is formed by the second polysilicon resistor R2 and the second capacitor C2, wherein an input of the second low pass filter is coupled to the drain of the first switch device N1 and corresponds to Vground1. An output of the second low pass filter is coupled to the second output of the signal extractor 122.

The first output of the signal extractor 122 Vhf1 comprises the ground noise Vground and a first high frequency component of the feedback voltage Vfb. The first high frequency component of the feedback voltage Vfb and the first high frequency component of the ground noise Vground are provided by the output of the first high pass filter. A first low frequency component of the ground noise Vground is provided by the output of the first low pass filter. The combination of the low and high pass filtering results in all frequency components of the ground noise Vground being passed to the first output of the signal extractor 122.

The second output of the signal extractor 122 Vhf2 comprises the ground noise Vground and a second high frequency component of the feedback voltage Vfb. The second high frequency component of the feedback voltage Vfb and the second high frequency component of the ground noise Vground are provided by the output of the second high pass filter. A second low frequency component of the ground noise Vground is provided by the output of the second low pass filter. The combination of the low and high pass filtering results in all frequency components of the ground noise Vground being passed to the second output of the signal extractor 122.

Figure 5A:
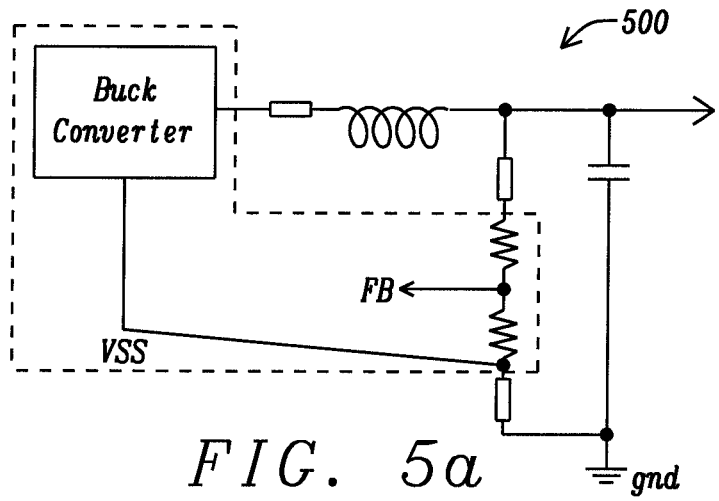
FIGS. 5a,5b,5c illustrate sources of ground noise and the suitability of the aforementioned ground noise rejection method for different cases of ground noise generation.
Figure 5B:
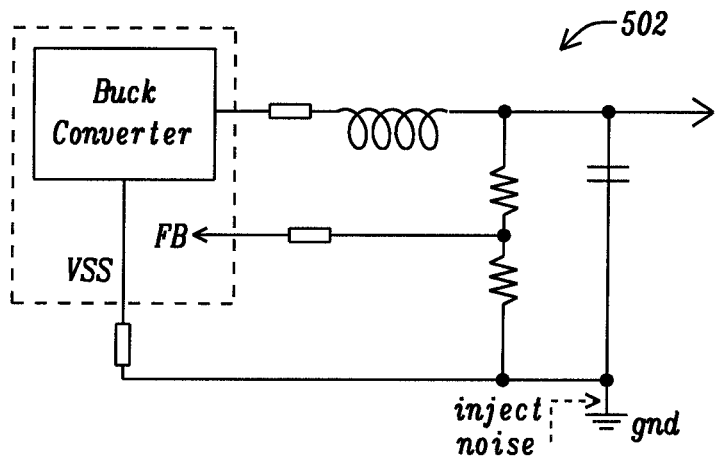
Figure 5C:
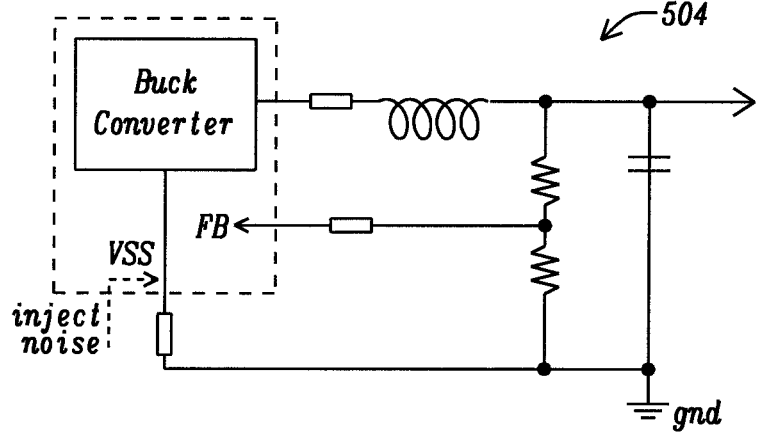

FIGS. 5a,5b,5c illustrate sources of ground noise and the suitability of the aforementioned ground noise rejection method for different cases of ground noise generation. When applied to buck converters with a fixed output voltage 500, the feedback voltage refers to the same ground as the compensator circuit and therefore the ground noise rejection method works well. When applied to ground noise generated outside the chip, for example ground noise arising from the coupling on a PCB, or noise current from the switches, for buck converters with adjustable output voltages 502, the ground noise rejection method also works well. When ground noise is generated inside the chip for buck converters with adjustable output voltages 504, the ground noise rejection method may not work well. In this case it may be necessary to reduce the noise on the ground rail the compensator is referred to by using a star connection of the ground rails on the layout.

Figure 6:
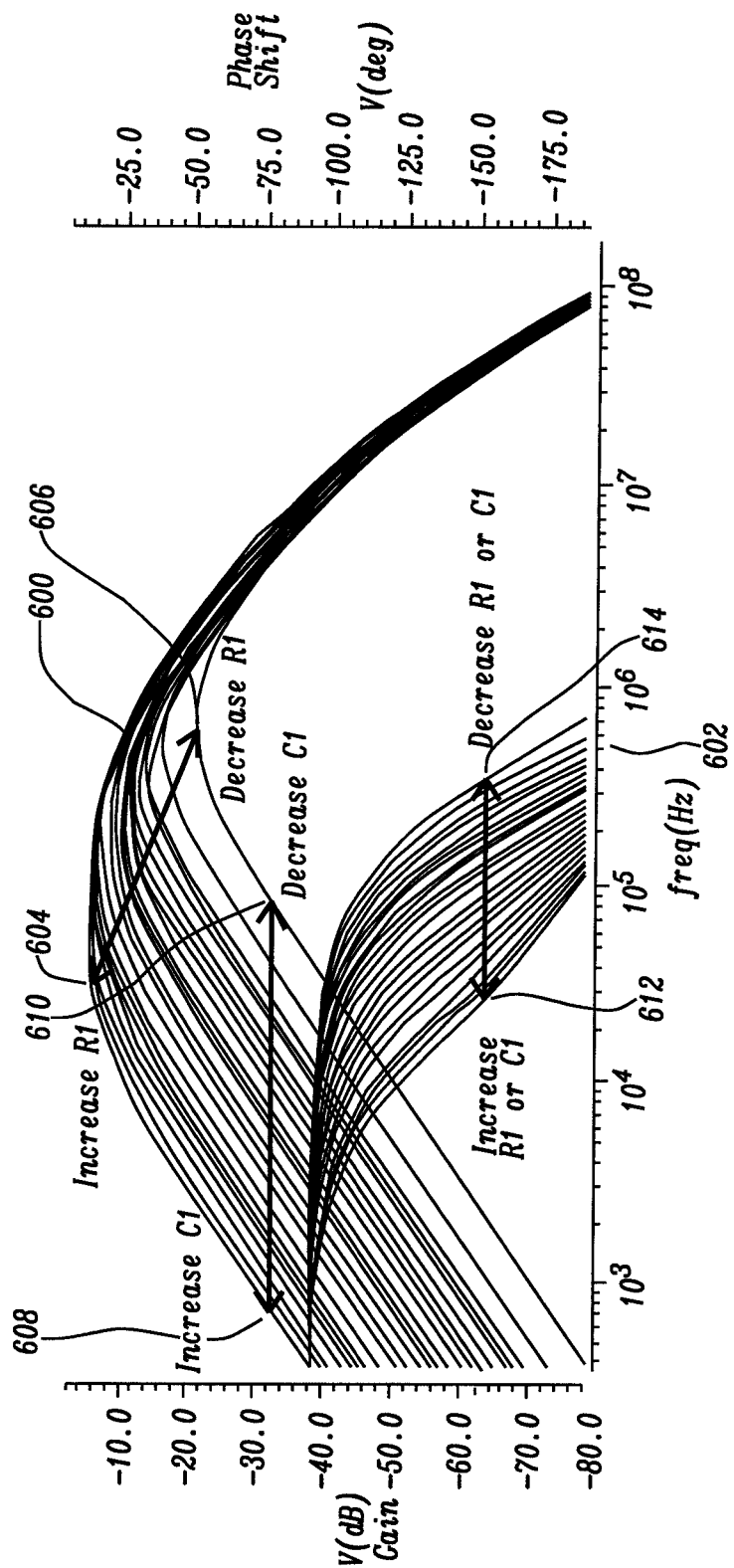
FIG. 6 is a simulated Bode plot of the compensator circuit corresponding to the embodiment shown in FIG. 4.

FIG. 6 shows simulated Bode plots of the compensator circuit 120 presented in FIG. 4 comprising plots of a gain 600 and plots of a phase shift 602 where a gain and a corner frequency of the first high pass filter is varied. The gain of the compensator circuit 120 can be varied by changing the gain of the differential amplifier 124. The corner frequency of the first high pass filter can be varied by changing the first polysilicon resistor R1 or by changing the first capacitor C1.

A qualitative discussion of the roles of the first polysilicon resistor R1 and the first capacitor C1 in altering the gain 600 and phase shift 602 of the compensator circuit 120 is as follows. Increasing R1 causes the gain 600 to increase and the gain curve 600 to shift to lower frequencies 604. Decreasing R1 causes the gain 600 to decrease and the gain curve 600 to shift to higher frequencies 606. Increasing C1 causes the gain curve 600 to shift to lower frequencies 608 and decreasing C1 causes the gain curve 600 to shift to higher frequencies 610. Increasing R1 or C1 causes the phase shift 602 to shift to lower frequencies 612. Decreasing R1 or C1 causes the phase shift 602 to shift to higher frequencies 614.

Qualitatively speaking, the phase shift 602 of the compensator circuit 120 is the same as the phase shift of the first high pass filter below 10 kHz, and the gain 600 of the compensator circuit 120 is the same as the gain of the first high pass filter multiplied by the gain of the differential amplifier 124 below 100 kHz. The gain 600 above 100 kHz and the phase shift 602 above 10 kHz include contributions from the second filtered voltage ramp Vhf2.

Figure 7:
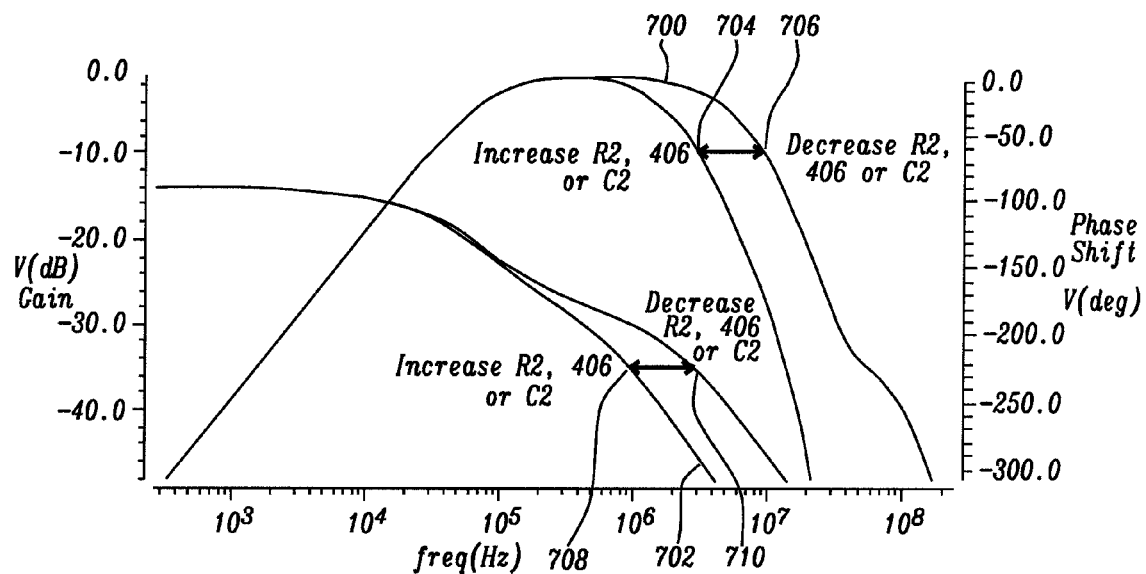
FIG. 7 is a further simulated Bode plot of the compensator circuit corresponding to the embodiment shown in FIG. 4.

FIG. 7 shows simulated Bode plots of the compensator circuit 120 presented in FIG. 4 comprising plots of a gain 700 and plots of a phase shift 702 where a corner frequency of the second high pass filter is varied. The corner frequency of the second high pass filter can be varied by changing the second polysilicon resistor R2 or by changing the second capacitor C2 or by changing the second NBL-to-poly capacitor 406.

A qualitative discussion of the roles of the second polysilicon resistor R2, the second capacitor C2 and the second NBL-to-poly capacitor 406 in altering the gain 700 and phase shift 702 of the compensator circuit 120 is as follows. Increasing R2, 406 or C2 causes the gain curve 700 to shift to lower frequencies 704. Decreasing R2, 406 or C2 causes the gain curve 700 to shift to higher frequencies 706. Increasing R2, 406 or C2 causes the phase shift 702 to shift to lower frequencies 708. Decreasing R2, 406 or C2 causes the phase shift 702 to shift to higher frequencies 710.

It can be observed in FIG. 6 and FIG. 7 that the compensator circuit 120 can provide a phase shift of less than 120° over a frequency range of 3 kHz to 200 kHz, adjusted by a digital setting. The digital setting may be implemented as follows. R1, R2, C1 and C2 each comprise several unit cells, wherein the number of unit cells coupled to the compensator circuit 120 can be controlled by a series of digital switches. Activating or deactivating unit cells associated with the resistors R1, R2 can alter their resistance and activating or deactivating unit cells associated with the capacitors C1, C2 can alter their capacitance.

Figure 8:
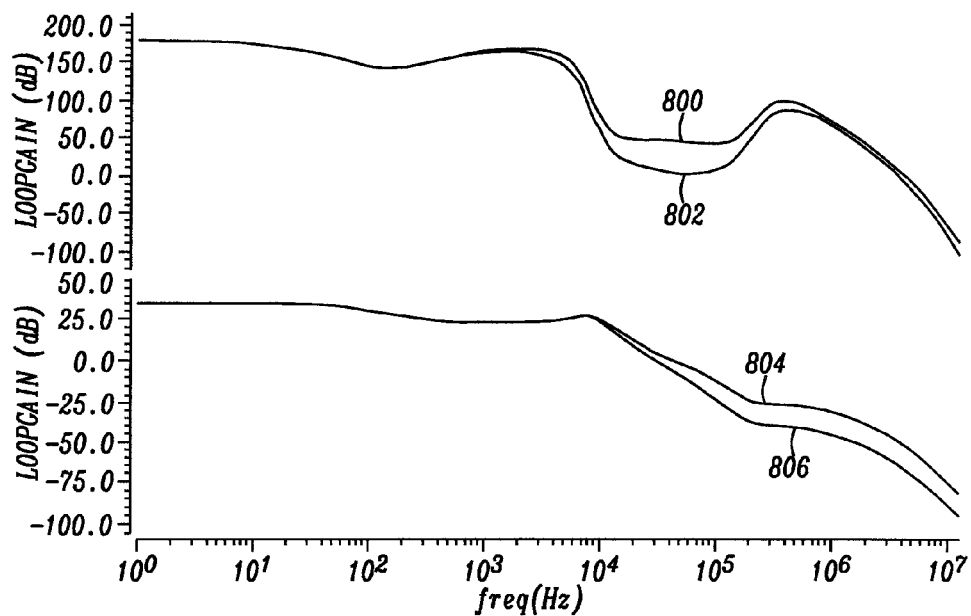
FIG. 8 is a simulated Bode plot of the switching power converter circuit operating as a buck converter for cases with and without the compensator circuit shown in FIG. 4.

FIG. 8 shows simulated Bode plots of a buck regulation loop of the switching power converter illustrated in FIG. 1 with the compensator circuit 120 and without the compensator circuit 120. The compensator circuit 120 corresponds to the compensator circuit 120 illustrated in FIG. 4. The simulated phase shift when the compensator circuit is used 800 demonstrates an improved phase margin of about 40° over the case without the compensator circuit 802. The Bode plot also shows the gain with the compensator circuit 804 and without the compensator circuit 806.

Figure 9:
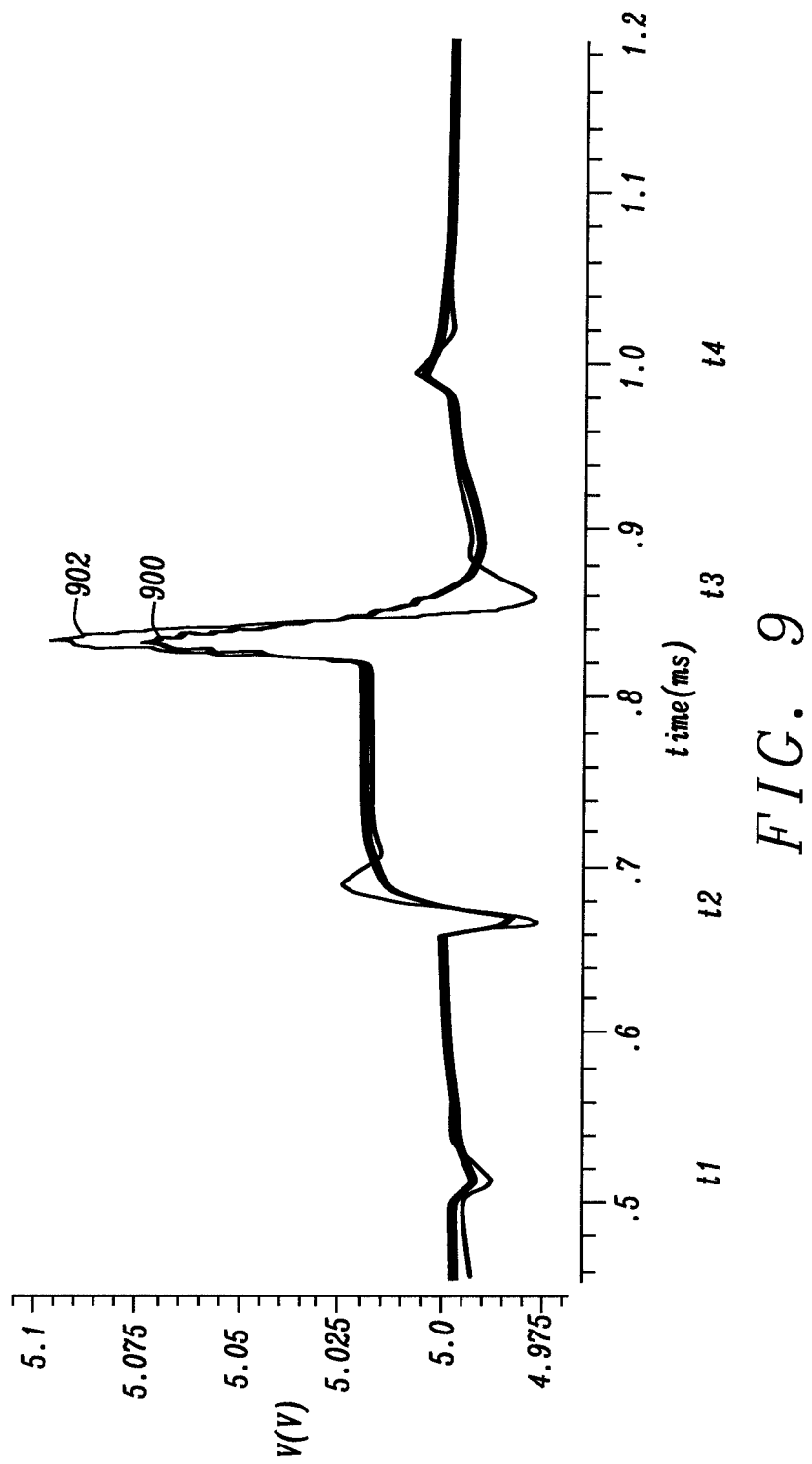
FIG. 9 shows the simulation results of the switching power converter, operating as a buck converter, voltage output when load transients occur with and without the compensator circuit shown in FIG. 4.

FIG. 9 shows the response of the output voltage Vout of the switching power converter illustrated in FIG. 1 with the compensator circuit illustrated in FIG. 4 900 and without the compensator circuit 902 under a load transient where the load current is varied. A load transient is applied at times t1, t2, t3 and t4. At t1 the load current increases from 200 mA to 1 A. At t2 the load current increases from 1 A to 15 A. At t3 the load current decreases from 15 A to 1 A and at t4 the load current decreases from 1 A to 200 mA.

At time t1 the switching power converter without the compensator circuit exhibits a larger undershoot than the switching power converter with the compensator circuit. At time t2 the switching power converter without the compensator circuit exhibits a larger voltage undershoot than the switching power converter with the compensator circuit, in addition to an overshoot which is not present when the compensator circuit is used. At time t3 the switching power converter without the compensator circuit exhibits a larger voltage overshoot and larger voltage undershoot than the switching power converter with the compensator circuit. At time t4 the switching power converter without the compensator circuit exhibits a larger overshoot than the switching power converter with the compensator circuit.

Figures 10A, 10B:
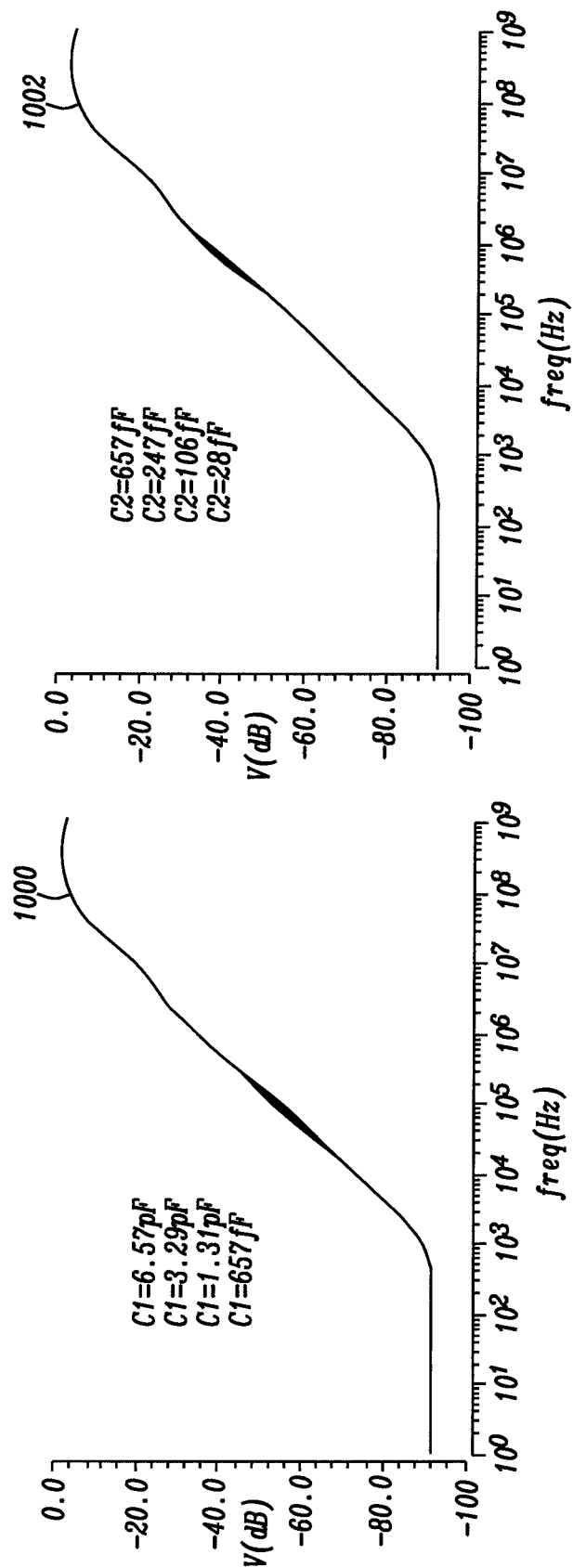
FIGS. 10a,10b show the simulated ground noise rejection of the compensator circuit shown in FIG. 4, where the capacitors are varied to illustrate the insensitivity of the ground noise rejection to variation of the capacitors in the circuit.

FIGS. 10a and 10b show the simulated ground noise rejection of the compensator circuit illustrated in FIG. 4 for different values of the first capacitor C1 1000 and the second capacitor C2 1002. However, in fact, varying the capacitors C1 and C2 has no impact on the ground noise rejection and so the curves overlap such that 1000 and 1002 are shown in FIGS. 10a and 10b effectively as single curves. The variation of the value of C1 and C2 has no impact on the ground noise rejection because the ground noise signal appears as a common mode signal at the input terminals of the differential amplifier 124.

Figure 11:
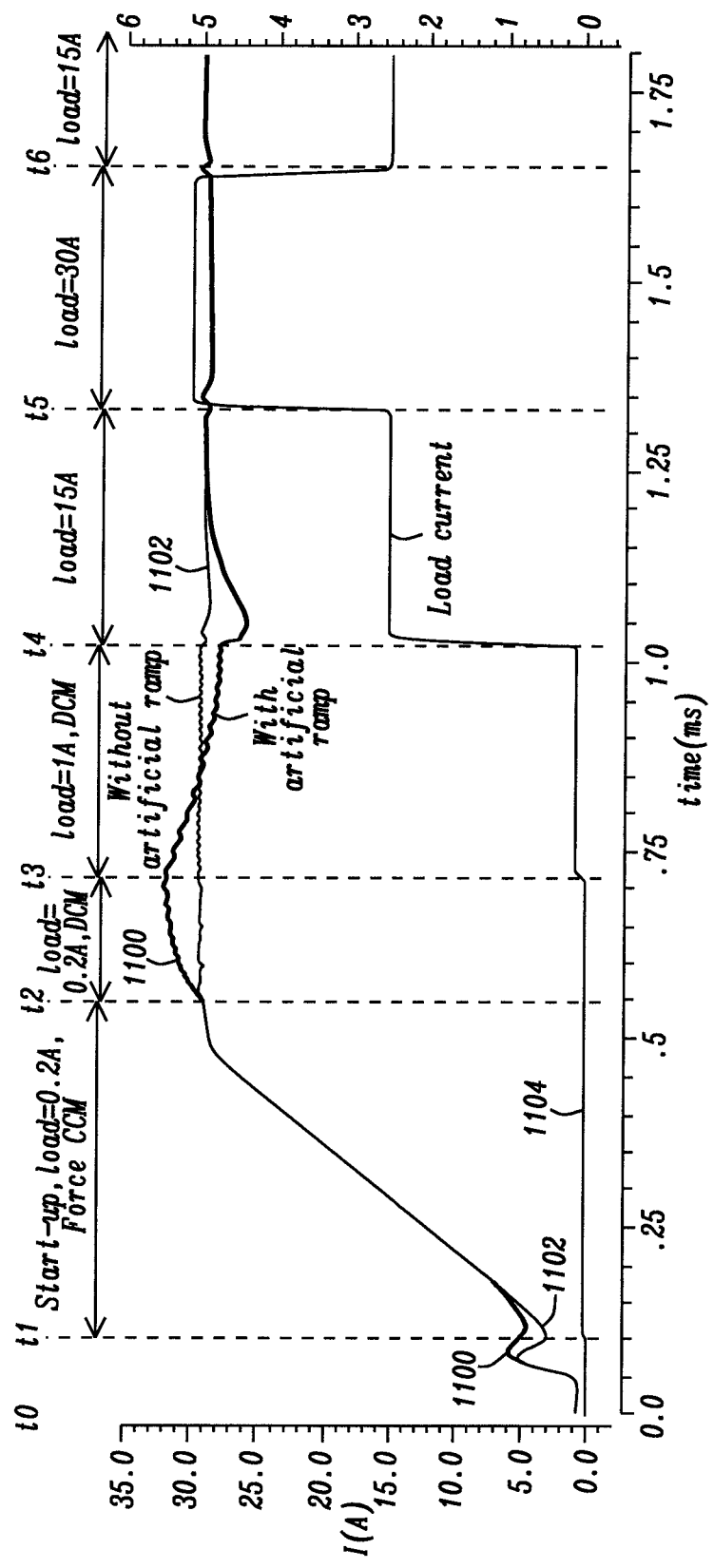
FIG. 11 shows the output voltage of the switching power converter Vout as was illustrated in FIG. 1, with the external ramp current and with the internal ramp current provided by the compensator circuit shown in FIG. 4 as the load current is varied.

FIG. 11 shows the output voltage of the switching power converter Vout as was illustrated in FIG. 1, with the external ramp current Itri 1100 and without Itri 1102, as the load current is varied 1104. Ihf is present in both cases. The compensator circuit 120 is implemented as shown in FIG. 4.

At time t0 the load current is 0 A and the output voltage of the switching regulator Vout beings to increase. Before time t1 the output voltage Vout displays a sudden drop because the buck control loop cannot regulate the output well when the output voltage is too small. At time t1 the load current is 0.2 A and the output voltage of the switching power converter Vout increases until time t2 where the Vout reaches a steady state. The switching power converter with the external ramp current Itri displays an overshoot of the voltage that is not seen in the circuit without Itri. At time t3 the load current is increased to 1 A. The output voltage of the switching power converter Vout with the external ramp current Itri decreases from its previous overshoot and displays an undershoot, whereas the output voltage of the switching power converter Vout without Itri does not exhibit significant variation. At time t4 the load current increases to 15 A and the switching power converter with the external ramp current Itri exhibits further Vout undershoot whereas the switching power converter without Itri exhibits only a slight undershoot and overshoot in Vout. At time t5 the load current increases to 30 A and at time t6 the load current decreases to 15 A. At time t5 and time t6 both switching power converters exhibit similar transient characteristics. Itri and/or Ihf are provided for the generation of a voltage ramp to ensure stability of the circuit.

Figure 12:
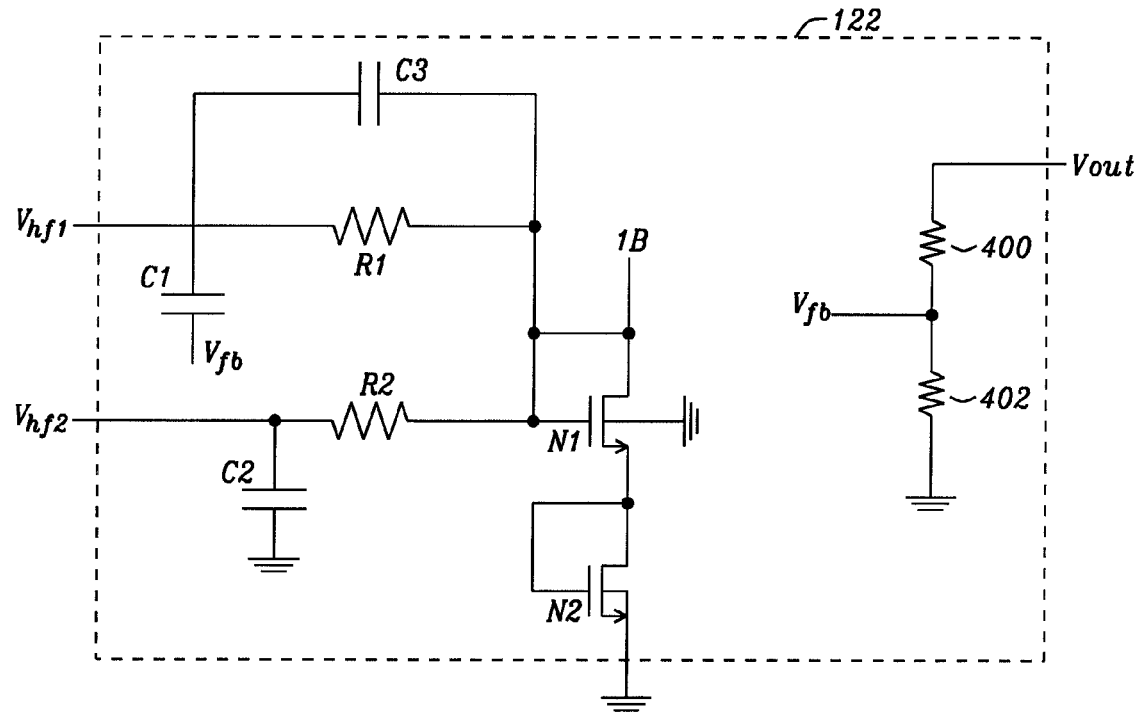
FIGS. 12-17 show various embodiments of the signal extractor shown in FIG. 1.

FIG. 12 shows another embodiment of the signal extractor 122 from FIG. 1. The signal extractor 122 design of this embodiment is as described in FIG. 4. However, here the NBL-to-poly capacitors 404, 406 have been removed and a tunable capacitor C3 is connected in parallel with the first polysilicon resistor R1. The second high pass filter now comprises the second capacitor C2, the tunable capacitor C3, the trans-impedance of N1, the trans-impedance of N2, and the second polysilicon resistor R2. The tunable capacitor C3 enables capacitive coupling of the first output Vhf1 of the signal extractor 122 to the second polysilicon resistor R2. The tunable capacitor C3 can also enable efficient tuning of the corner frequency of the second high pass filter. Tuning may be achieved using the digital setting with a series of switches as described in the discussion of FIG. 7.

Figure 13:
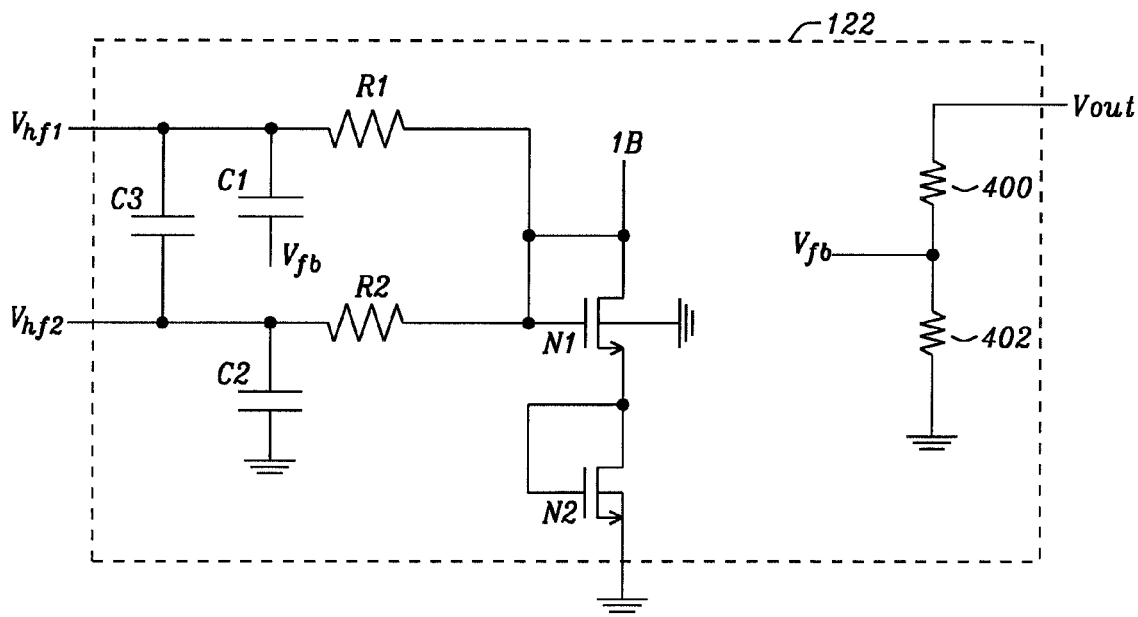

FIG. 13 shows another embodiment of the signal extractor 122 from FIG. 1. The signal extractor 122 design is as described in FIG. 12. However, in this embodiment tunable capacitor C3 is not connected as described previously, but has a first terminal coupled with the first output terminal of the signal extractor and has a second terminal coupled with the second output terminal of the signal extractor. The second high pass filter now comprises the second capacitor C2, the tunable capacitor C3, the trans-impedance of N1, the trans-impedance of N2, and the second polysilicon resistor R2. The tunable capacitor C3 enables capacitive coupling of the first output Vhf1 of the signal extractor 122 to the second polysilicon resistor R2. Increasing C3 can decrease the frequency of the second pole of the gain 600 and decreasing C3 can increase the frequency of the second pole of the gain 600.

Figure 14:
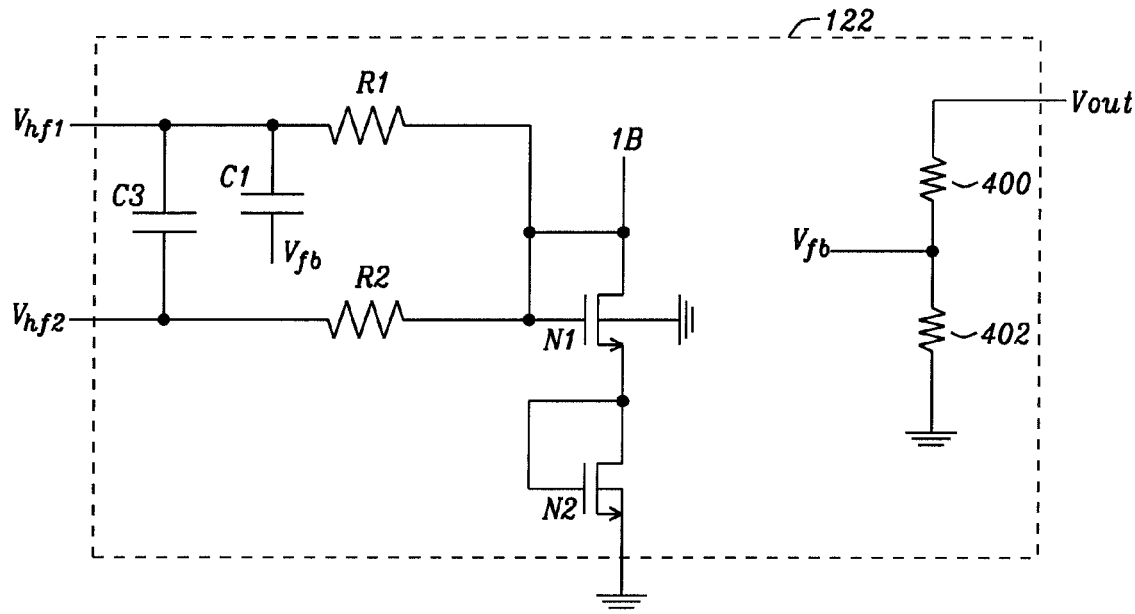

FIG. 14 shows another embodiment of the signal extractor 122 from FIG. 1. The signal extractor 122 design is as described in FIG. 13, however in this embodiment the second capacitor C2 has been removed. The second high pass filter now comprises the tunable capacitor C3, the trans-impedance of N1, the trans-impedance of N2, and the second polysilicon resistor R2. Increasing C3 can decrease the frequency of the second pole of the gain 600 and decreasing C3 can increase the frequency of the second pole of the gain 600.

In the embodiments presented in FIG. 12-14 the feedback voltage Vfb may be filtered at a lower frequency than is achievable using the embodiment presented in FIG. 4.

In the embodiments presented in FIGS. 12-13 the second resistor R2 and second capacitor C2 may both be set to zero without losing the functionality as described previously for the respective Figures. In the embodiment presented in FIG. 14, the second resistor R2 may be set to zero without losing the functionality as described previously.

Figure 15:
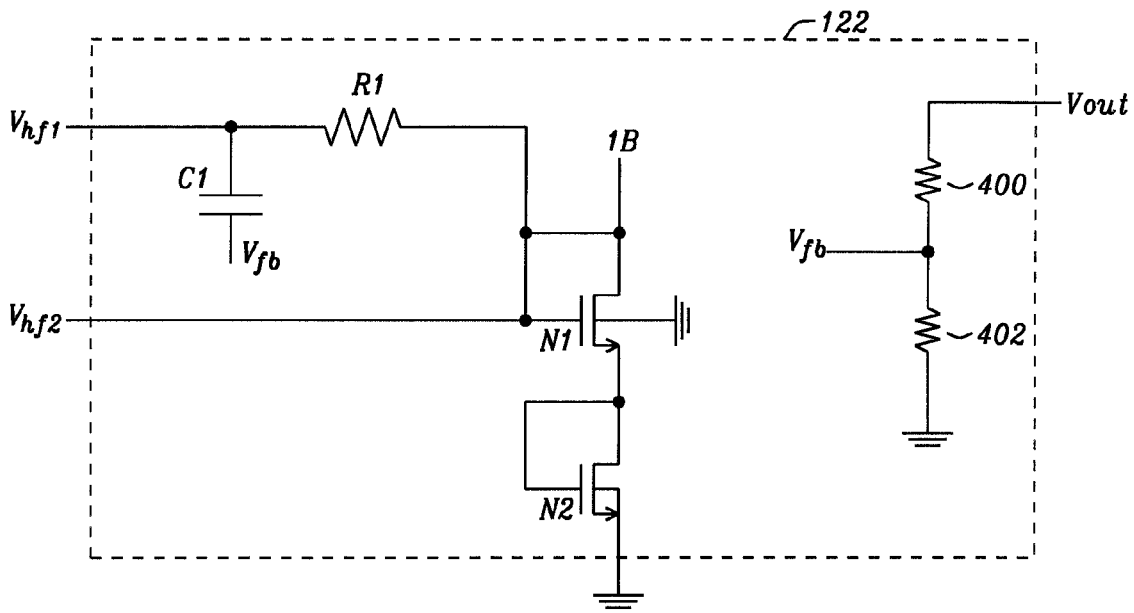

FIG. 15 shows another embodiment of the signal extractor 122 from FIG. 1. The signal extractor 122 design is as described in FIG. 4, however the second polysilicon resistor R2, the second capacitor C2, the first NBL-to-poly capacitor 404 and the second NBL-to-poly capacitor 406 have been removed. Removing the previously listed components results in the second pole in the gain 600 being removed.

Figure 16:
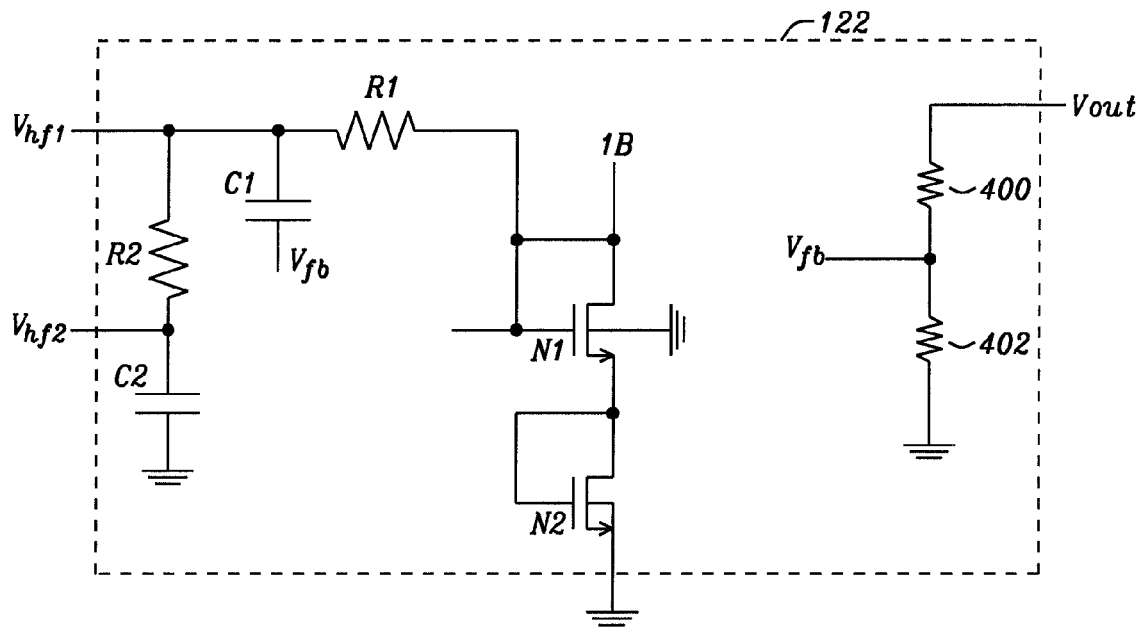

FIG. 16 shows another embodiment of the signal extractor 122 from FIG. 1. The signal extractor 122 design is as described in FIG. 12, however tunable capacitor C3 has been removed and the second terminal of the second resistor R2 is not coupled to the drain of the switching device N1. The first terminal of the second resistor R2 is coupled to the output of the signal extractor 122. The signal extractor provides the function of a second order high pass filter, thereby generating two zeroes that can provide a larger phase increase to the buck control loop.

Figure 17:
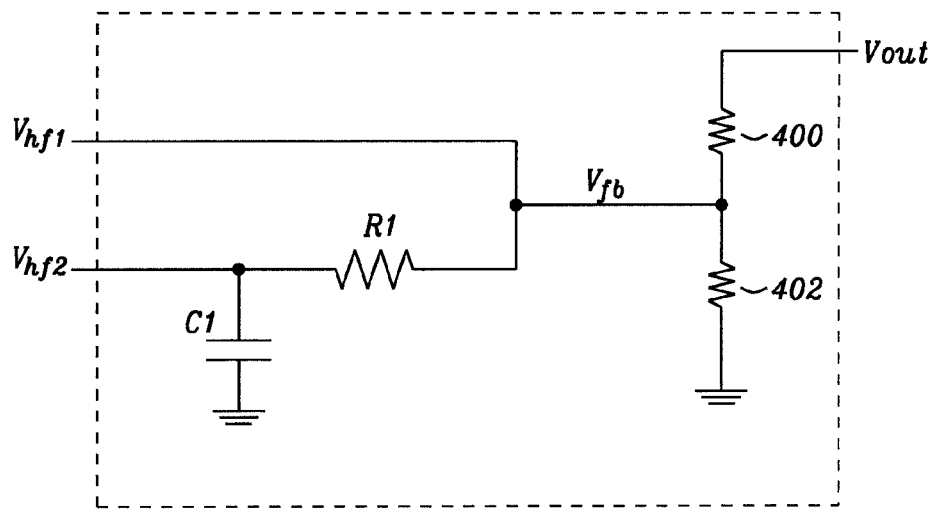

FIG. 17 shows another embodiment of the signal extractor 122 from FIG. 1. The signal extractor comprises the potential divider for extracting the feedback voltage Vfb, as described previously. The first output of the signal extractor 122 receives the feedback voltage Vfb. The second terminal of the polysilicon resistor R1 is coupled with the feedback node of the potential divider. The first terminal of the polysilicon resistor R1 is coupled to the first terminal of the capacitor C1. The capacitor C1 has a second terminal coupled to ground. The first terminal of the polysilicon resistor R1 is also coupled to the output of the signal extractor 122.

Figure 18:
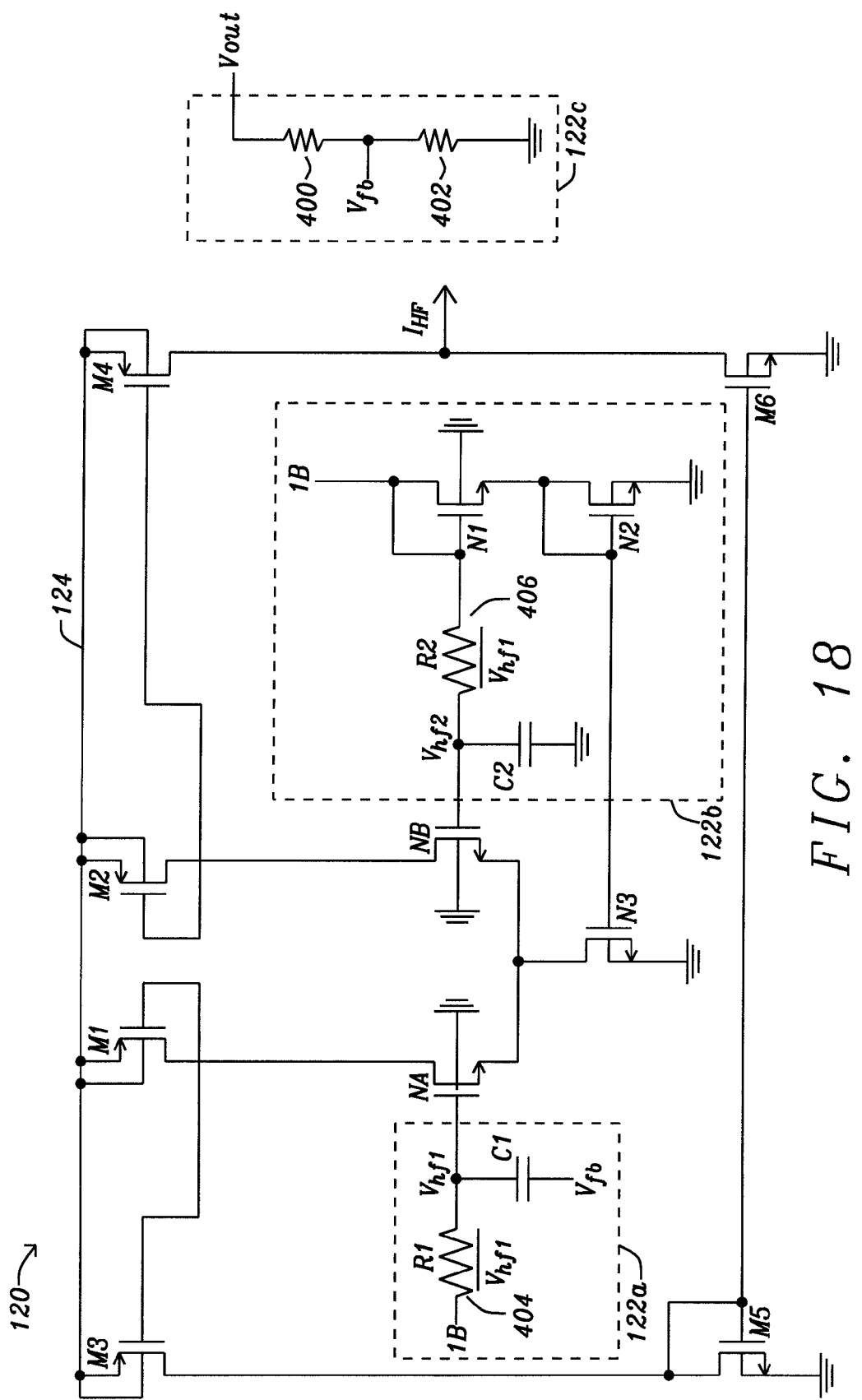
FIGS. 18-20 show various embodiments of the differential amplifier combined with the signal extractor.

FIG. 18 shows another embodiment of the compensator circuit 120 from FIG. 1. The signal extractor 122 comprises circuits 122a, 122b and 122c, and corresponds to the signal extractor 122 shown in FIG. 4. The differential amplifier 124 is a differential amplifier. The differential amplifier 124 comprises a third switch device N3, for example a third MOSFET that has a gate coupled to the gate of the second switch device N2 thereby forming a current mirror. The differential amplifier 124 further comprises a fourth switch device NA that has a gate coupled to the first output of the signal extractor 122, and a fifth switch device NB that has a gate coupled to the second output of the signal extractor 122. The differential amplifier 124 further comprises a plurality of switching elements M1, M2, M3, M4, M5, M6 arranged to output Ihf.

Figure 19:
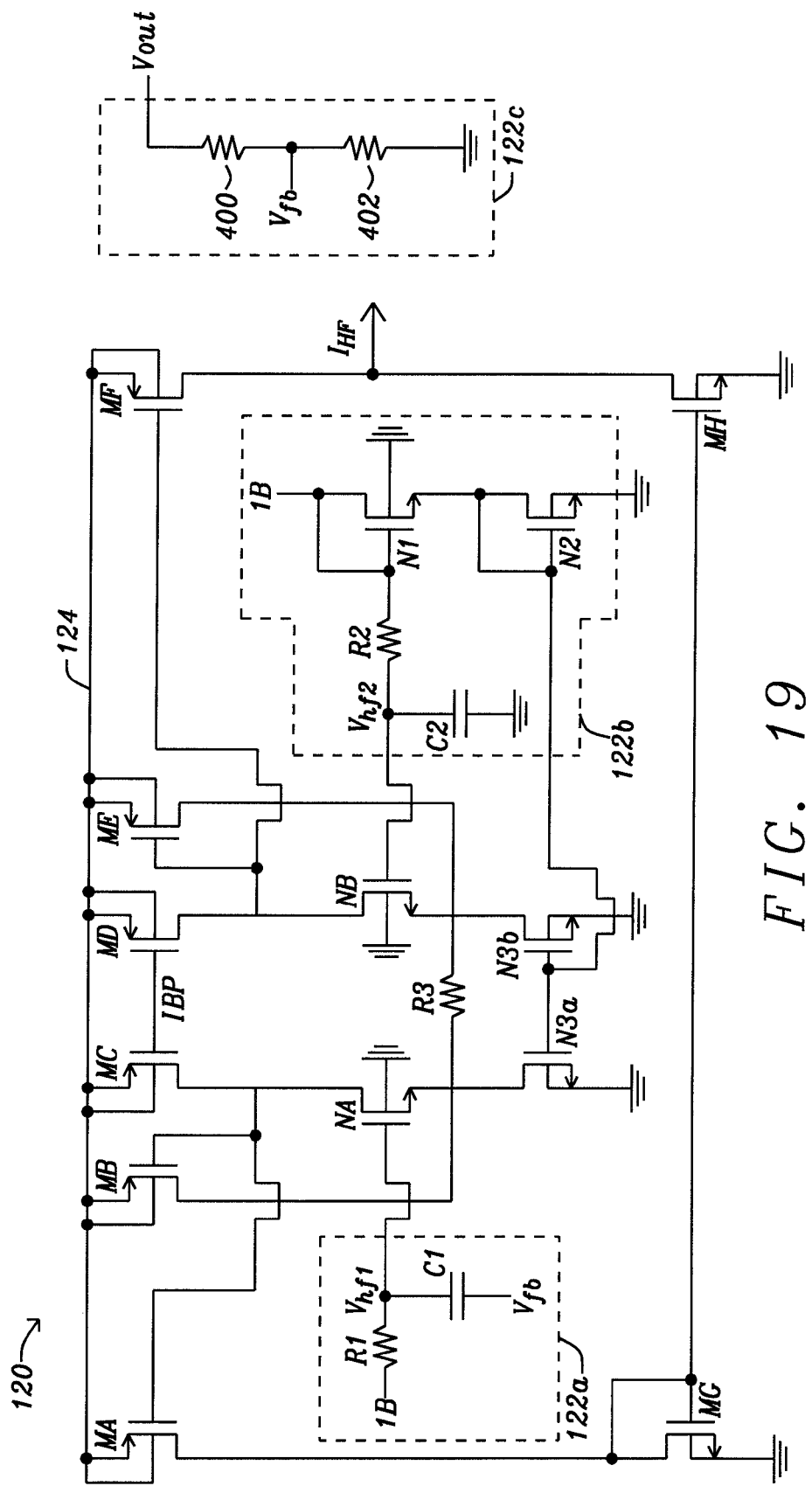

FIG. 19 shows another embodiment of the compensator circuit 120 from FIG. 1. The signal extractor 122 comprises circuits 122a, 122b and 122c. The differential amplifier 124 comprises a third switch device N3a and a fourth switch device N3b, for example a third and fourth MOSFET, respectively, that each have a gate coupled to the gate of the second switch device N2. The differential amplifier further comprises a fifth switch device NA that has a gate coupled to the first output of the signal extractor 122, and a sixth switch device NB that has a gate coupled to the second output of the signal extractor 122. The differential amplifier 124 further comprises a plurality of switching elements MA, MB, MC, MD, ME, MF, MG, MH arranged to output Ihf. A first bias voltage IBP is coupled to a gate of the switching element MC and a gate of the switching element MD. The topology of the differential amplifier 124 is arranged to output Ihf that is inversely proportional to a third resistor R3.

Figure 20:
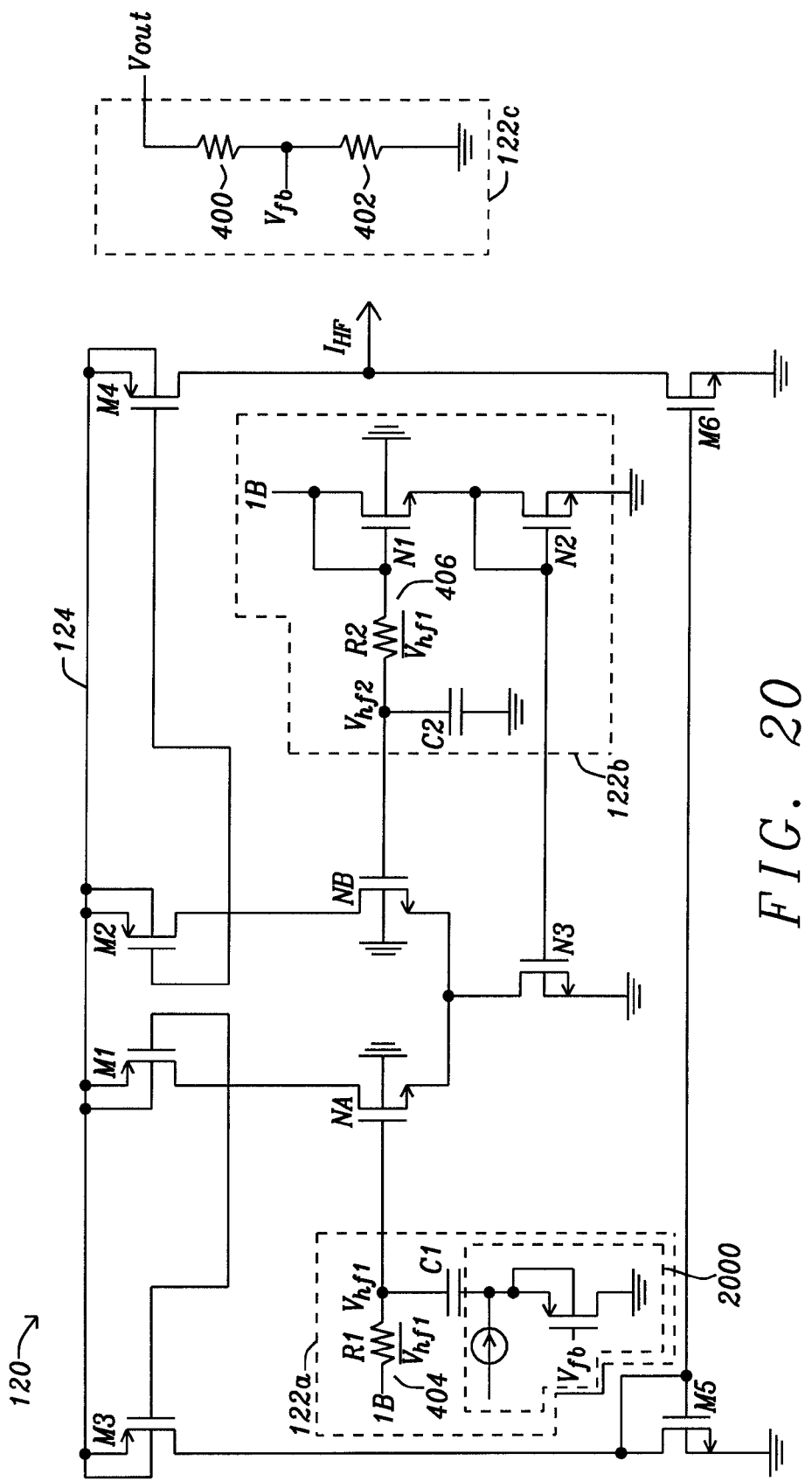

FIG. 20 shows another embodiment of the compensator circuit 120 from FIG. 1. The signal extractor 122 comprises circuits 122a, 122b and 122c and corresponds to the signal extractor 122 shown in FIG. 4 however in this embodiment the feedback voltage Vfb is coupled to the signal extractor 122 through a buffer 2000.

Figure 21:
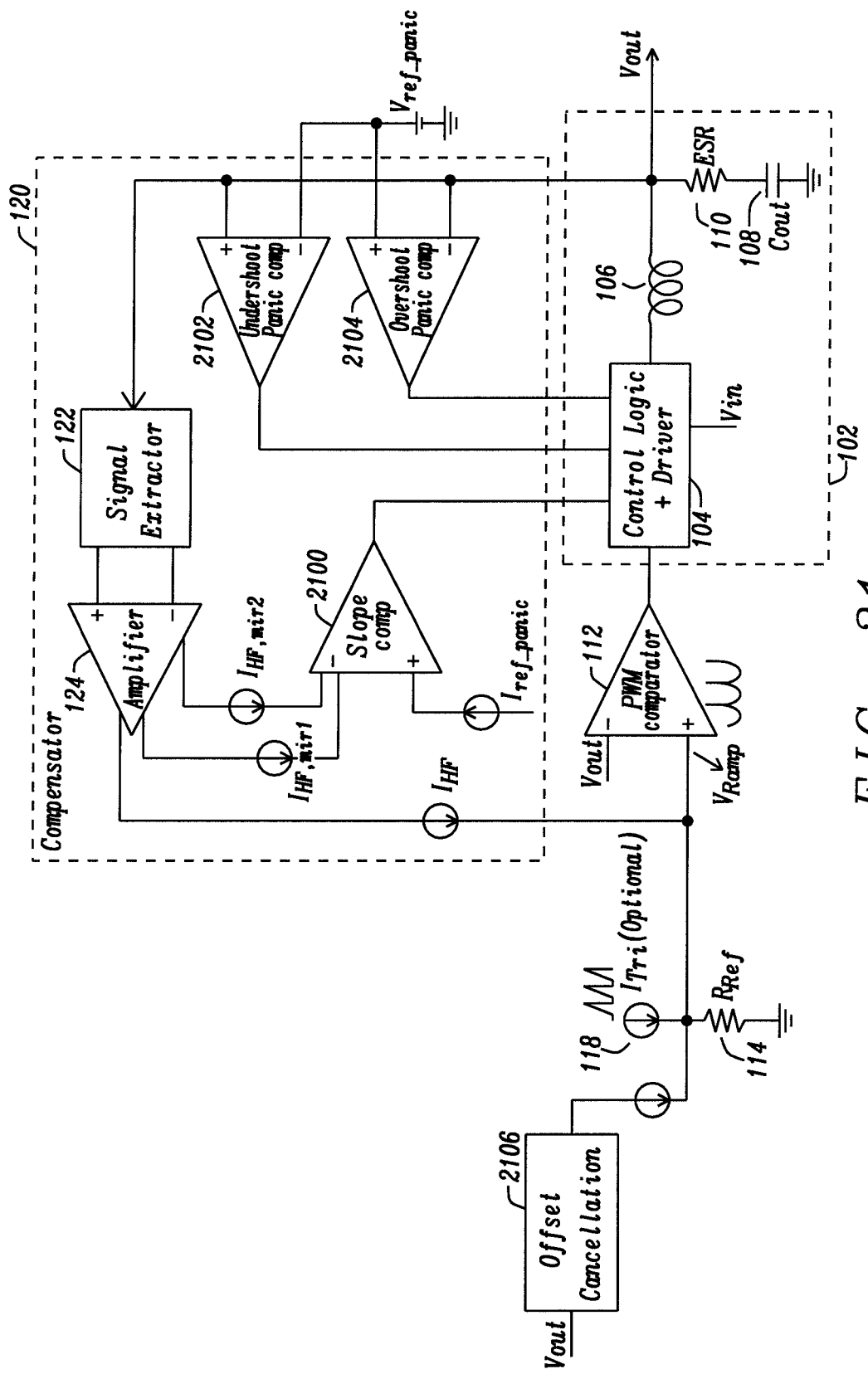
FIG. 21 shows an embodiment of the compensator circuit which includes a slope comparator, undershoot panic comparator and overshoot panic comparator.

FIG. 21 shows an embodiment of the compensator circuit 120 which includes a slope comparator 2100, an undershoot panic comparator 2102 and an overshoot panic comparator 2104. A slope comparator 2100 is arranged to detect the slope of the output voltage Vout. The undershoot panic comparator 2102 is arranged to detect when the output voltage Vout drops below a threshold value and the overshoot comparator 2104 is arranged to detect when the output voltage Vout rises above a threshold. Under different conditions associated with a load transient, the slope comparator 2100 and the panic comparators 2102, 2104 can be used to control the PWM switching mechanism, thereby improving the transient response of the switching converter. The power stage 102 may be replaced by circuitry for other types of converters such as a boost converter, buck-boost converter or other type of switching power regulator is in itself well known to a person skilled in the art.

Figure 23:
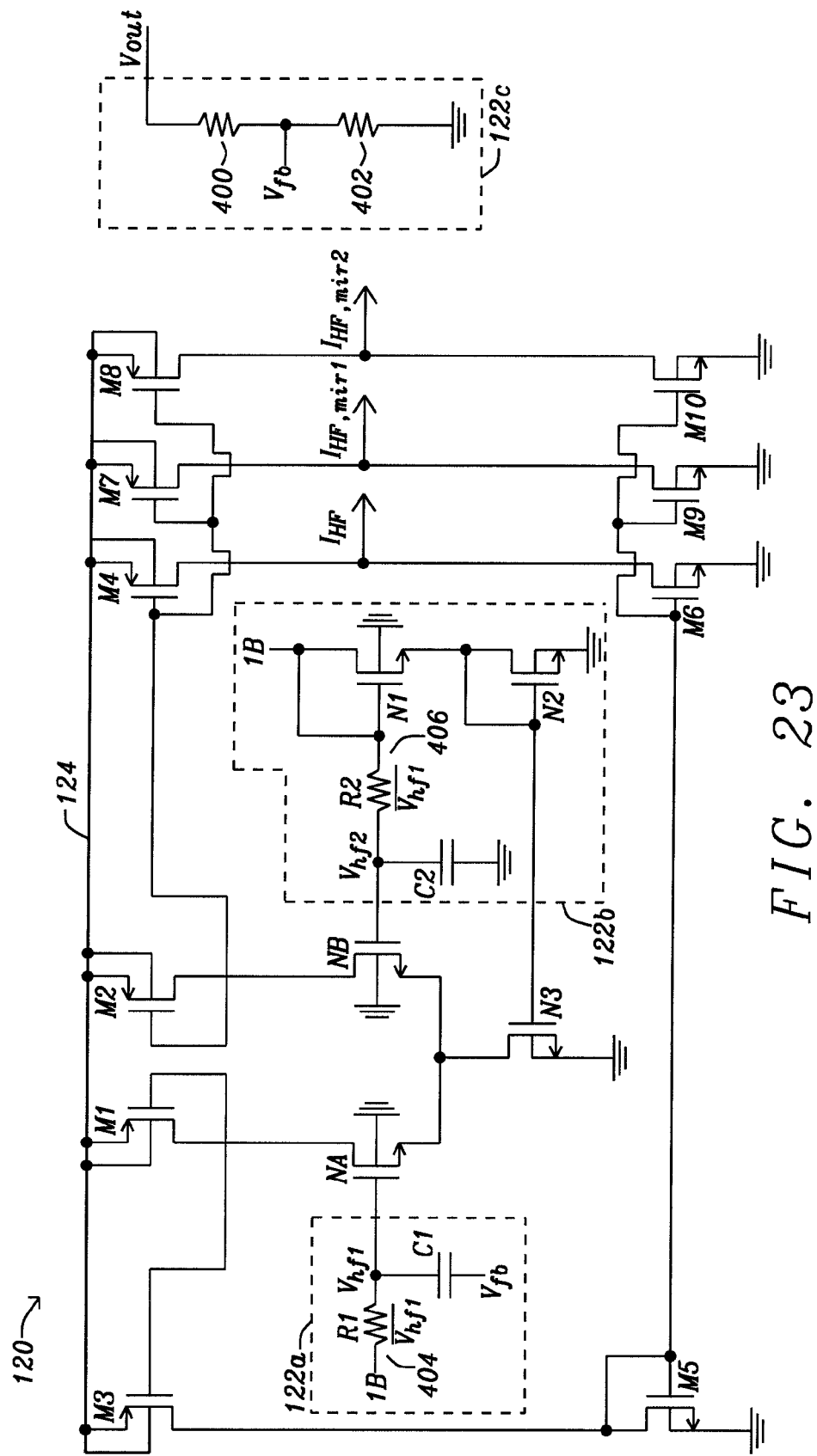
FIG. 23 shows an embodiment of a differential amplifier combined with a signal extractor.

The offset cancellation circuit 2106 may be provided by an error amplifier 116 as shown in FIG. 1. In this embodiment, in addition to Ihf, the differential amplifier outputs a second current Ihf,mir1 and a third current Ihf,mir2. The slope comparator 2100 has a first input coupled to Ihf,mir1, a second input coupled to Ihf,mir2 and a third input coupled to a reference panic current Iref,panic. An example of how to generate Ihf,mir1 and Ihf,mir2 is shown in FIG. 23, which shows an embodiment of the compensator circuit 120 shown in FIG. 18 with the addition of additional switching elements M7, M8, M9 and M10, arranged to output Ihf,mir1 and Ihf,mir2.

An output of the slope comparator 2100 is coupled to the control logic and drivers 104. Under normal operation Ihf,mir1 and Ihf,mir2 are less than Iref,panic and the slope comparator 2100 outputs a logic low signal. When Vout decreases, Ihf,mir1 and Ihf,mir2 increase ("increase" means that the current flowing out of 124 increases) and when Ihf,mir1 exceeds Iref,panic the slope comparator 2100 outputs a logic high signal. On the other hand, when Vout increases, Ihf,mir1 and Ihf,mir2 decrease and may become negative ("negative" means that the current flows into 124). When Ihf,mir2 is negative with absolute value larger than Iref,panic the slope comparator 2100 outputs a logic high signal. The logic signal can be used to override the PWM switching mechanism as well as the panic function to render a better transient response.

The undershoot panic comparator 2102 has a first input (for example non-inverting) coupled to the output of the switching regulator power converter Vout and has a second input (for example inverting) coupled to a reference panic voltage Vref,panic. An output of the undershoot panic comparator 2102 is coupled to an input of the control logic and drivers 104.

The overshoot panic comparator 2104 has a first input (for example non-inverting) coupled to the reference panic voltage Vref,panic and has a second input (for example inverting) coupled to the output of the switching regulator power converter Vout. An output of the overshoot panic comparator 2104 is coupled to an input of the control logic and drivers 104.

Figure 24:
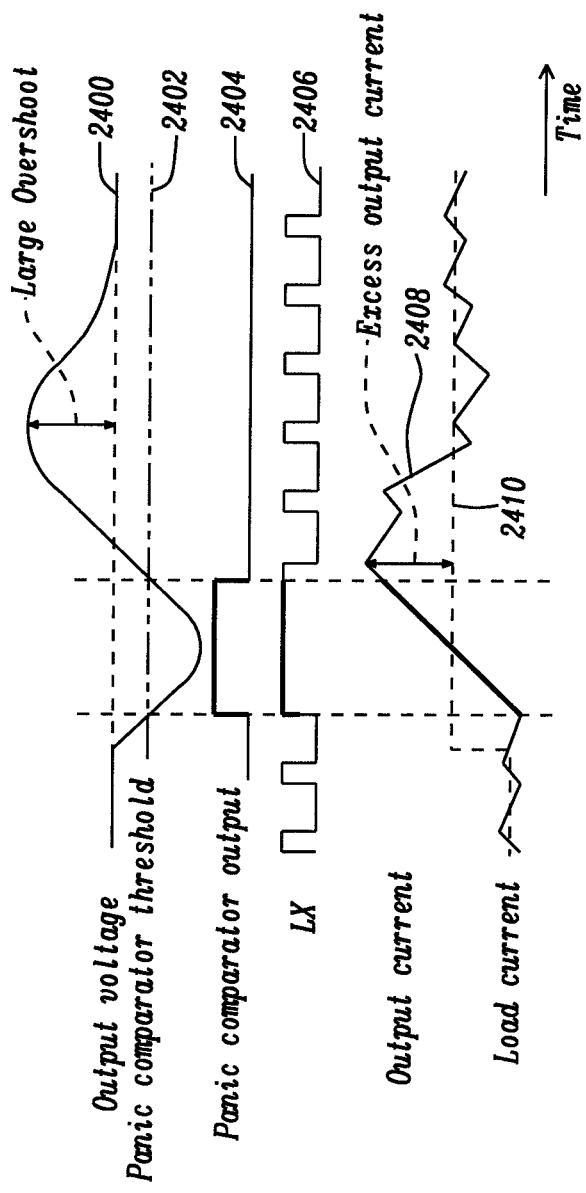
FIG. 24 shows a response of a buck converter with a panic comparator under a load transient.

Suppose the buck converter suffers from a light load to heavy load transient. The buck converter output voltage, Vout, drops and has a large undershoot. To recover the output faster, the output of the undershoot panic comparator 2102 overrides the PWM signal and turns on the high side switch. Without the slope comparator 2100, the high side switch will not be turned off until the undershoot panic comparator 2102 outputs a low signal. However, when the undershoot panic comparator 2102 outputs a low signal the buck converter output voltage Vout is almost back to its nominal value. So, even the high side switch is closed at this time, the inductor current will keep charging up the buck converter output and results in an overshoot, as shown in FIG. 24. FIG. 24 shows the transient behaviour of the buck converter illustrated in FIG. 21 without the slope comparator 2100. The following features are shown: output voltage Vout 2400, panic comparator threshold 2402, panic comparator output 2404, high side switch state 2406, output current 2408 and load current 2410.

Figure 25:
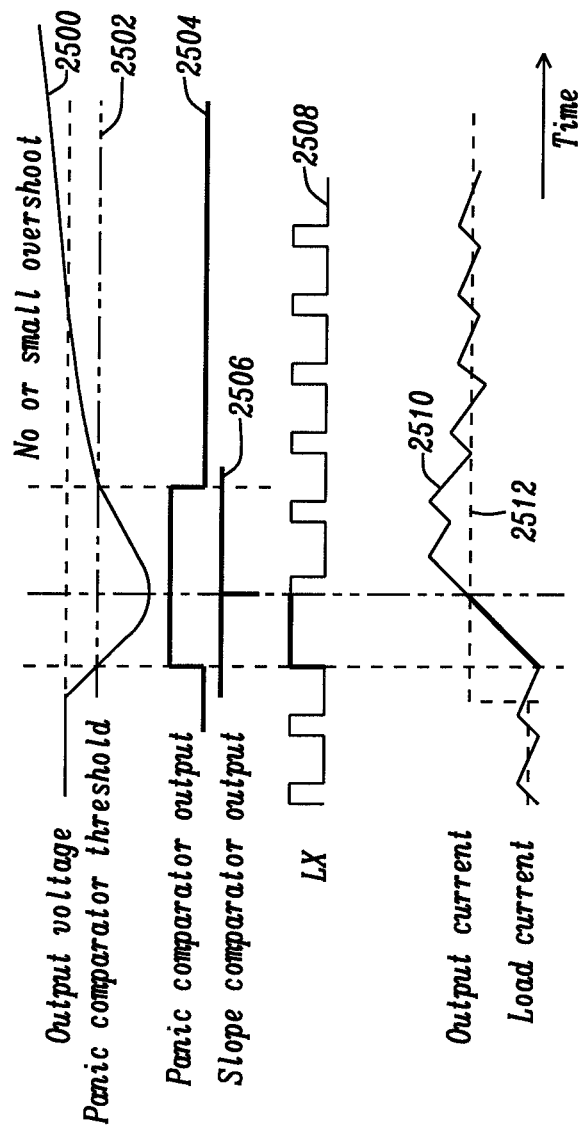
FIG. 25 shows a response of a buck converter with a panic comparator and a slope comparator under a load transient.

On the other hand, with the inclusion of the slope comparator 2100, the high side switch can be turned off when the slope comparator 2100 outputs a low pulse signal so the overshoot can be reduced, as shown in FIG. 25. FIG. 25 shows the transient behaviour of the buck converter illustrated in FIG. 21. The following features are shown: output voltage Vout 2500, panic comparator threshold 2502, panic comparator output 2504, slope comparator output 2506, high side switch state 2508, output current 2510 and load current 2512.

Figure 22:
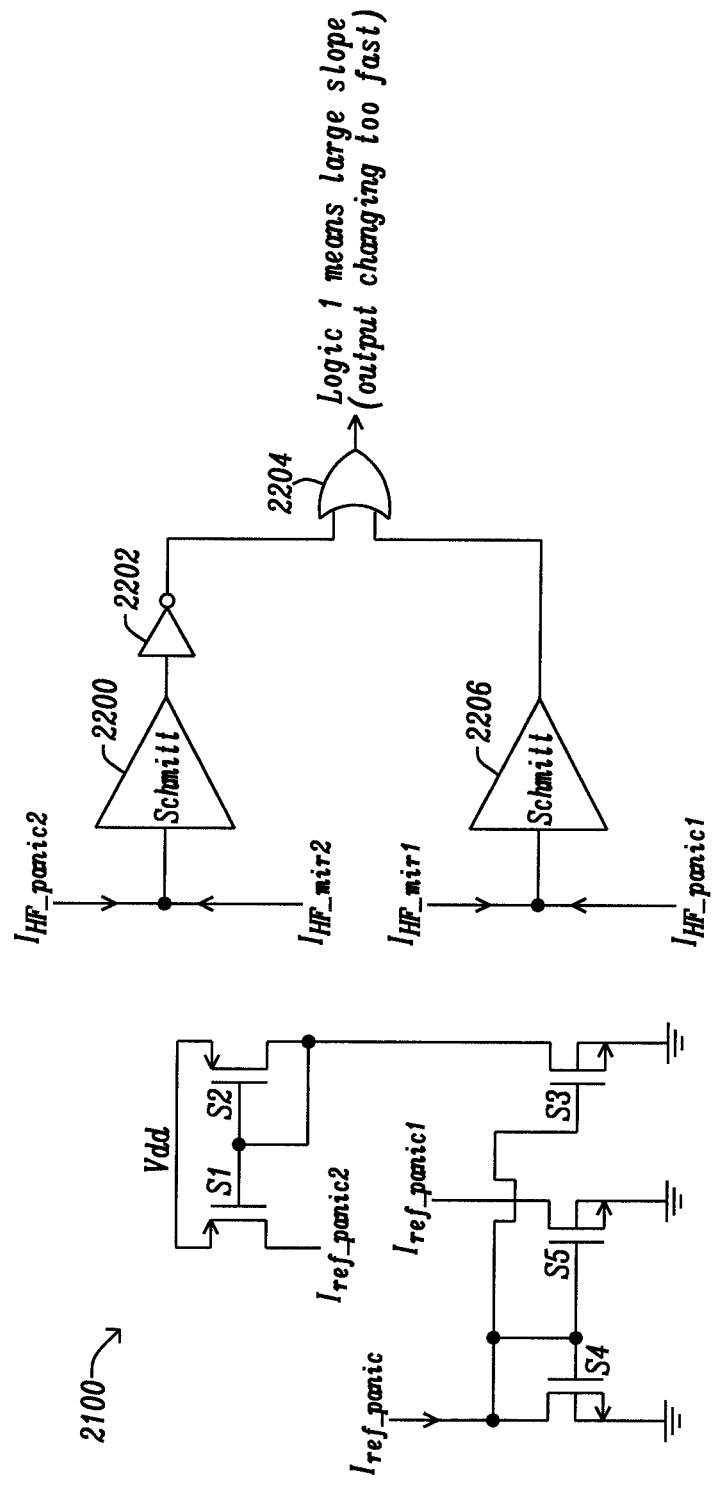
FIG. 22 shows an example embodiment implementation of the slope comparator.

FIG. 22 shows an example implementation of the slope comparator 2100. A voltage vdd is coupled to a source of a switching element S1 and a source of a switching element S2. A gate of the switching element S1 is coupled to a gate of the switching element S2. A drain of the switching element S1 is coupled to a second reference panic current Iref_panic2. The gate of the switching element S2 is coupled to a drain of the switching element S2. The drain of the switching element S2 is coupled to a drain of a switching element S3 which has a source coupled to ground. A gate of the switching element S3 is coupled to a drain and a gate of a switching element S4 and a gate of a switching element S5. The switching element S4 has a source coupled to ground. The drain of the switching element S4 is coupled to the reference panic current Iref panic. A drain of the switching element S5 is coupled to a first reference panic current Iref_panic1 and has a source coupled to ground. The reference panic current Iref_panic is used to generate Iref_panic1 and Iref_panic2 by the basic operating principle of a current mirror. However, the final value of Iref_panic1 and Iref_panic2 also depend on Ihf,mir1 and Ihf,mir2. For example, if Iref_panic increases, we expect Iref_panic1 (flowing to ground) to increase. However, if Ihf,mir1 also flows to ground, the drain of S5 will be pulled to ground and S5 will be turned off. Therefore Iref_panic1 will be zero. On the other hand, if Ihf,mir1 is large and flows out of ground, we can expect Iref_panic1 to increase with Iref_panic.

The second reference panic current Iref_panic2 and Ihf,mir2 are coupled to an input of a first Schmitt trigger 2200. An output of the first Schmitt trigger 2200 is coupled to an input of an inverter 2202. An output of the inverter 2202 is coupled to a first input of an OR gate 2204.

The first reference panic current Iref_panic1 and Ihf,mir1 are coupled to an input of a second Schmitt trigger 2206. An output of the second Schmitt trigger 2206 is coupled to a second input of the OR gate 2204.

In operation if Ihf_mir2 is negative with absolute value larger than Iref_panic2, the first Schmitt trigger 2200 will output a low logic (for example logic 0) signal. For other cases the first Schmitt trigger 2200 will output a high logic (for example logic 1) signal. The high/low logic signal will be inverted by the inverter 2202 and a low/high signal will be received by the OR gate 2204 at its first input.

In operation if Ihf_mir1 is greater than Iref_panic1, the second Schmitt trigger 2206 will output a high logic (for example logic 1) signal. For other cases the second Schmitt trigger 2206 will output a low logic (for example logic 0) signal. The high logic/low logic signal will be received by the OR gate 2204 at its second input.

If the OR gate 2204 receives a high signal at one or both of its inputs it will output a high signal. If it receives a low signal at both of its inputs it will output a low signal. The output of the OR gate 2204 corresponds to the output of the slope comparator 2100 and is coupled to the control logic and drivers 104. A logic high signal overrides the PWM switching mechanism as well as the panic function as described previously.

Various improvements and modifications may be made to the above without departing from the scope of the disclosure.

What is claimed is:

1. A controller for a switching power converter of the type comprising one or more power switches, said controller comprising:
   a pulse width modulation comparator arranged to output a digital control signal to control the power switches of the switching power converter;

a first input of the pulse width modulation comparator is derived from an output voltage of the switching power converter via a first feedback path;

a second input of the pulse width modulation comparator is derived from the output voltage of the switching power converter via a second feedback path; wherein one of the feedback paths comprises a signal extractor and a differential amplifier; and the signal extractor is arranged to filter the output voltage to obtain a first voltage signal in a first frequency range and a second voltage signal in a second frequency range being different from said first frequency range, said first and second voltage signals sharing a common noise component; and to present said first and second voltage signals as respective first and second inputs to the differential amplifier.

2. The controller of claim 1, wherein the signal extractor comprises:
   a first filter network;
   a second filter network;
   a first coupling network arranged to extract ground noise and couple said extracted ground noise to both of said first and second filter networks; and
   a second coupling network is arranged to extract a feedback voltage comprising contributions from the output voltage and ground noise for processing by both of said first and second filter networks.

3. The controller of claim 2, wherein the first and second filter networks act sequentially on the feedback voltage.

4. The controller of claim 2, wherein the first and second filter networks are both coupled with the feedback voltage.

5. The controller of claim 2, wherein the first filter network has a first cut-off frequency and is arranged to high-pass filter the feedback voltage and to low-pass filter the ground noise, and the second filter network has a second cut-off frequency and is arranged to high-pass filter the feedback voltage and to low-pass filter the ground noise.

6. The controller of claim 2, wherein the first filter network has a first cut-off frequency and is arranged to low-pass filter the feedback voltage and to high-pass filter the ground noise, and the second filter network has a second cut-off frequency and is arranged to low-pass filter the feedback voltage and to high-pass filter the ground noise.

7. The controller of claim 2, wherein the first coupling network comprises a current source for providing a bias current, and a grounded resistive element; said current source and resistive element being coupled for providing an output with ground noise.

8. The controller of claim 7, further comprising a second resistive element in series with said grounded resistive element.

9. The controller of claim 8, wherein the grounded resistive element and/or the second resistive element comprises a diode connected transistor.

10. The controller of claim 2, wherein the second coupling network comprises a potential divider such that the feedback voltage comprises a scaled output voltage and ground noise.

11. The controller of claim 1, wherein the differential amplifier is a transconductance amplifier that outputs a current signal that is passed to a reference resistor to generate a voltage ramp that is coupled to the second input of the pulse width modulation comparator.

12. A method of controlling the operation of a switching power converter of the type comprising a pulse width modulation comparator and one or more power switches, said method comprising:
   deriving a first PWM input from an output voltage and presenting the input via a first feedback path;
   deriving a second PWM input from an output voltage and presenting the input via a second feedback path;
   at one of said paths, filtering the output voltage to obtain a first voltage signal in a first frequency range and a second voltage signal in a second frequency range being different from said first frequency range, said first and second voltage signals sharing a common noise component; and
   presenting said first and second voltage signals as respective first and second inputs to a differential amplifier.

13. The method of claim 12, wherein a signal extractor comprises:
   a first filter network;
   a second filter network;
   a first coupling network arranged to extract ground noise and couple said extracted ground noise to both of said first and second filter networks; and
   a second coupling network is arranged to extract a feedback voltage comprising contributions from the output voltage and ground noise for processing by both of said first and second filter networks.

14. The method of claim 13, wherein the first and second filter networks act sequentially on the feedback voltage.

15. The method of claim 13, wherein the first and second filter networks are both coupled with the feedback voltage.

16. The method of claim 13, wherein the first filter network has a first cut-off frequency and is arranged to high-pass filter the feedback voltage and to low-pass filter the ground noise, and the second filter network has a second cut-off frequency and is arranged to high-pass filter the feedback voltage and to low-pass filter the ground noise.

17. The method of claim 13, wherein the first filter network has a first cut-off frequency and is arranged to low-pass filter the feedback voltage and to high-pass filter the ground noise, and the second filter network has a second cut-off frequency and is arranged to low-pass filter the feedback voltage and to high-pass filter the ground noise.

18. The method of claim 13, wherein the first coupling network comprises a current source for providing a bias current, and a grounded resistive element; said current source and resistive element being coupled for providing an output with ground noise.

19. The method of claim 18, further comprising a second resistive element in series with said grounded resistive element.

20. The method of claim 19, wherein the grounded resistive element and/or the second resistive element comprises a diode connected transistor.

21. The method of claim 13, wherein the second coupling network comprises a potential divider such that the feedback voltage comprises a scaled output voltage and ground noise.

22. The method of claim 12, wherein the differential amplifier is a transconductance amplifier that outputs a current signal that is passed to a reference resistor to generate a voltage ramp that is coupled to the second input of the pulse width modulation comparator.

* * * * *